United States Patent
Parent et al.

(10) Patent No.: US 11,028,472 B2
(45) Date of Patent: Jun. 8, 2021

(54) INTEGRATED 3D METALLIZER

(71) Applicant: INTEGRATED 3D METALLIZING, LLC, Gray, ME (US)

(72) Inventors: Donald G. Parent, Gray, ME (US); John F. Feeley, St. Petersburg, FL (US)

(*) Notice: Subject to any disclaimer, the term of this patent is extended or adjusted under 35 U.S.C. 154(b) by 0 days.

(21) Appl. No.: 16/301,926

(22) PCT Filed: May 15, 2017

(86) PCT No.: PCT/US2017/032696
§ 371 (c)(1),
(2) Date: Nov. 15, 2018

(87) PCT Pub. No.: WO2017/200933
PCT Pub. Date: Nov. 23, 2017

(65) Prior Publication Data
US 2019/0284682 A1    Sep. 19, 2019

Related U.S. Application Data

(60) Provisional application No. 62/337,112, filed on May 16, 2016.

(51) Int. Cl.
*C23C 14/50* (2006.01)
*C23C 14/34* (2006.01)
*C23C 14/14* (2006.01)

(52) U.S. Cl.
CPC ............ *C23C 14/505* (2013.01); *C23C 14/14* (2013.01); *C23C 14/34* (2013.01); *C23C 14/50* (2013.01)

(58) Field of Classification Search
None
See application file for complete search history.

(56) References Cited

U.S. PATENT DOCUMENTS

| | | | | |
|---|---|---|---|---|
| 6,471,837 B1* | 10/2002 | Hans | ................... | B01J 3/03 118/500 |
| 2003/0015136 A1* | 1/2003 | Giacri | ................... | C23C 14/505 118/500 |
| 2005/0126497 A1* | 6/2005 | Kidd | ................... | C23C 14/505 118/730 |
| 2017/0356082 A1* | 12/2017 | Parent | ................... | C23C 14/505 |

* cited by examiner

*Primary Examiner* — Jethro M. Pence
(74) *Attorney, Agent, or Firm* — Tredecim LLC; Sean L. Sweeney

(57) ABSTRACT

An apparatus and method for metallizing parts in an efficient manner. The apparatus includes a plurality of plates stacked vertically and spaced from one another, wherein each plate has an outer perimeter. There is a plurality of part supports arranged about the outer perimeter of each plate. A support frame is secured to the plurality of plates such that it may rotate about the outer perimeter of the plates while maintaining substantially the same distance from the outer perimeter of each plate. There is one or more rotation drive systems attached to the support frame and positioned such that one or more compliant drive fingers are in close proximity to the outer perimeter of each plate. The stacked plates may be moved between a metallizer and parts loading and unloading stations in a convenient manner.

16 Claims, 34 Drawing Sheets

INTEGRATED 3D METALLIZER

BACKGROUND

1. Field of the Invention

The present invention pertains to the field of metallizing devices. Specifically, this invention relates to a novel device, process and system for metallizing high volumes of plastic parts.

2. Discussion of Background Information

A. Background to High Volume Metallizing of Plastic Parts.

Technologies for metallizing plastic parts are well known. One common means of metallizing plastic parts utilizes physical vapor deposition (PVD). PVD encompasses several methods for metal layer deposition, including sputtering, evaporation, cathodic arc deposition and others. For clarity, it is expressly understood that where the term "metal" is used, the term encompasses true metals and metallic compounds, such as $Ti_xN_y$, ITO, $Al_xO_y$, $Si_xO_y$, and $Si_xN_y$, known to one of skill in the art to be applied via PVD.

Currently, the largest plastic part metallizing applications are on automotive components and cosmetics products, such as lipsticks and nail enamel products. There is a large quantity of high-volume plastic packaging components sold worldwide, mostly sourced in Asia, with some programs using 10-30 million units per year. However, due to the typical upcharge cost from these Asian manufacturers for metallizing, only the higher end mass products and prestige products utilize metallizing. If costs can be reduced, it will open the market for the metallization of a significantly larger proportion of the plastic parts used in the personal care and cosmetics industries.

B. How Metallizing is Done Now

Existing systems designed to metallize small parts are based on technology that has been available for 40 years or more. A basic system applies a basecoat to the parts, applies a metal layer over the basecoat, and applies a topcoat to protect the metal layer. Typically, the basecoat and topcoat are paint layers applied outside the metallizer.

There are many variations of this basic system. The foundation of a paint system is a conveyor that transports parts on spindles through the various paint stations. These conveyors are often of a chain-on-edge configuration consisting of a series of chain links, much like a large bicycle chain, positioned on its side with pins extending from the chain link hinge points. Often the pins will have the ability to rotate and will have a rotation drive ring or sprocket causing the pin to rotate when engaged with a secondary drive chain located at key locations, such as the spray booth. In some implementations, the paint systems used to apply the basecoat and topcoat spray the coating on the parts and the coating is then dried or cured. Common drying and curing techniques include air drying, thermal curing, and UV curing. Other paint systems, such as flow coating, are utilized more for trophies and other similar items and do not lend themselves to caps and other components used in the personal care and cosmetics industries.

Traditional metallizing lines cost approximately $3-5 million and take up approximately 10,000 square feet of space. The state-of-the-art lines used by the best cosmetic metallizers in Europe and Asia typically include two UV cure paint lines and two six-foot cylindrical tank evaporative metallizers.

Within these systems, rods, which are rigid, linear devices, are sometimes used to consolidate parts into groups such that an entire group can be removed or placed on the conveyor by simply handling a rod rather than handling individual parts or spindles. Because the conveyors in these systems are loaded and unloaded manually by operators, a rod-based system reduces handling labor associated with moving parts between the conveyors and the metallizer since groups rather than individual parts are moved. Rods can be any length, however lengths of 1 foot to 4 feet in length are common. For small parts, rod-based systems typically utilize pins spaced at appropriate pitches to provide a highest practical part density while providing for reliable mechanical separation and good coverage. Pitches in the range of every 1.25 inches to 1.5 inches are common. Spindles and parts are mounted atop of the pins and are capable of individually rotating for spraying.

These lines typically process about 120 small pieces per minute (2 parts per second), with labor cost representing a significant portion of the variable cost to run the lines and representing the majority of the price difference between Asian and western European facilities. Here in the U.S. there are few metallizing lines of this style. Therefore, pricing levels are substantially higher for cosmetic quality parts.

Existing metallizing systems utilizing a basecoat and a topcoat have been developed to maximize the visual appearance and durability of the metal coating. Small plastic parts are base-coated with a paint to smooth out microscopic and visually detectable flaws in the injection molded plastic surfaces. During the last 15 years, near-cosmetic quality metallized parts have been produced without the use of a base-coat. However, these applications have only been successful with the use of specialized materials, highly polished well-maintained molds, and close proximity of molding and metallizing.

Evaporation metallizers using aluminum are the simplest and least expensive types of vacuum metallizing machinery. The evaporated consumable is aluminum which is an inexpensive material that closely resembles polished silver when metallized on a shiny substrate. Thin evaporated aluminum would not hold up well for most consumer products and is over-coated with a transparent spray paint for that reason. For parts that require a silver look, a clear paint is used. For a gold color the same paint can be tinted with dyes to achieve a gold look. Although virtually any color can be duplicated, silver and gold are by far the two most common colors used to decorate packaging.

The most effective way to uniformly coat a small plastic part with paint to ensure a high quality end result is by the use of a spray line with fixed spray guns, where the parts rotate in front of the guns. To shorten the length of the long coating lines, the use of UV cure paints has been used. Although they often cost more than conventional paints, the reduction in floor space, and the improved quality and durability of the UV coatings justifies the higher cost per gallon.

Metallizers for evaporating or sputtering aluminum on small parts have typically utilized cylindrical tank chambers ranging from 48 inches long by 28 inches diameter to 72 inches long by 72 inches diameter. While smaller and faster batch systems with time saving load locks have served well for some simple configurations, existing systems utilizing cylindrical tank chambers to metallize small parts suffer from several drawbacks. For example, systems utilizing metallizers with smaller chambers have limited maximum system throughput, while systems utilizing larger chambers experience long batch times and high system costs.

C. Problems and Limitations of Traditional Methodology.

There are numerous alternatives to PVD for applying metal coatings to small parts. One alternative technology is hot stamping, which utilizes a pressed on foil that is typically silver or gold metallic. However, while hot stamping commonly utilizes a custom die to create a band or a pattern, such as specific artwork, full coverage of even the simplest part geometries is not practical with this process. Another alternative decorative technology that can utilize metallic foils is in-mold labeling. However, in-mold labeling is not widely used because it greatly increases the part molding tool costs and significantly lengthens the molding cycle time.

Silver reduction, such as is disclosed in Publication No. US20110155444, is another competitive technology that can coat an entire part surface with a metallic look. However, this process suffers from many of the same issues of traditional metallizing such as high system costs, large floor space requirements, reliance on volatile organic compounds (VOCs) for basecoats and topcoats, and the need for a technical staff to keep the lines running and maintained. In addition, other specific downfalls of the silver reduction process include: the use of the precious metal silver, rather than less expensive metals; the propensity of the silver to tarnish; the use of large amounts of water and high velocity air; the inability to properly cover more complex geometries; and a typically inferior surface finish.

Yet another non-PVD technology for covering a plastic part with a metal coating is referred to as "electroplating" or "electro-less plating." Advantages of this coating method include: generally high-quality looking films; the ability to quickly deposit thicker coatings, which may smooth out small surface imperfections in the plastic; and metallic coatings that are mechanically and chemically superior to other "metallizing" processes. The disadvantages to the plating processes include: a limited number of plastic substrates, namely ABS and special PP grades, are used for cosmetic decorative applications; parts need to be submerged in a series of expensive aqueous "baths" that require constant supervision and maintenance by a technical staff; a limited number of commonly available metals; the heavier coatings of metal make a flexible cap inflexible; the racks supporting the parts can be expensive; and the processing of racks through subsequent baths requires considerable labor or automation.

In addition, existing PVD systems also have significant drawbacks. There are numerous problems associated with the typical metallizing systems utilizing one or two large chambers and one or two accompanying paint lines. First, the substantial capital costs are prohibitive to most industries. In addition, even in industries where these systems are in place, such as the cosmetics industry, the variable cost of running the system is very high, especially when compared against other manufacturing alternatives such as specialty molding materials or decorative technologies such as hot stamping. Traditional metallizing lines also consume an inordinate amount of floor space in comparison to typical molding and print decoration lines. As floor space costs go higher the value proposition for a metallizing line decreases. Additionally, traditional metallizing lines require non-direct labor expenses such as engineers, technicians, maintenance equipment, and training to keep them running.

Environmental concerns also weigh against these traditional metallizing lines due to the chemicals and solvents (VOCs) used in the associated paint systems. Growing compliance costs associated with use of these chemicals is eroding the attractiveness of these systems.

In practice, the protection afforded by applying UV and other hard-coats is often excessive. These topcoats were designed to ensure that the metal layer could withstand the substantial wear and tear resulting from long exposures to skin cremes, fragrances, and resistance to abrasion. Alternatives to UV and other hard-coats exist from industrial paint suppliers, but the costs and benefits associated with these alternatives for lower end personal care products do not differ significantly from the traditional methods. Further, even where alternative topcoats are able to reduce variable costs, the air-dry paint systems require large drying ovens that add to the capital cost and occupy significant floor space. In limited situations, such as with automobile parts, coatings are being applied as an additional and separate process within the vacuum metallizer process chamber. However, while these in-chamber coatings show great promise to reduce costs, they have yet to be adapted for high-volume, low-end applications such as bathroom, household and personal care products.

Traditional metallizing processes have been difficult to automate due to their batch-oriented design. Many batch metallizers can decorate 4000 parts or more within a single batch with cycle times in the range of 20 to 25 minutes. The large batch nature of these systems require two sets of racks, with one rack being loaded while the second is in process in the metallizer. These racks are large in size and contain complex mechanisms to move parts in an orbital manner during the deposition sequence to assure coating uniformity. Part positioning for loading of such racks is often unreliable, making automation of the process impractical. Further, since the basecoat and topcoat systems are inline continuous processes and the metallizer is a batch device, at least one cycle of work-in-process parts must be accumulated between the basecoat line and the metallizer and another between the metallizer and the topcoat line. Often human operators manually remove parts and spindles from the conveyors and place them on the metallizer rack, and then remove parts from the metallizer rack and place them on the topcoat conveyor. This can be done individually or with groups of parts positioned on rods to reduce manual labor content. The combination of complex and unreliable rack systems, large quantities of work-in-process between stations, and complex part motions makes automation of such systems problematic.

Manually loaded metallizers may utilize part racks to facilitate the simultaneous metallization of multiple parts. However, these part racks, such as the part rack disclosed in U.S. Pat. No. 6,471,837 suffer from several disadvantages. Most importantly, because these part racks are not adapted for automated loading and unloading they require a significant amount of manual labor. The use of manual labor increases the risk of part damage, which necessitates the use of base coats and top coats to achieve an acceptable metal coating. Not surprisingly, known part racks are adapted to hold a relatively small number of parts at a very low part density. In addition, where rotation of individual parts is envisioned, the rotation mechanisms are quite crude, consisting of little more than a fixed rod that contacts the rack.

In addition to the scrap resulting from damage imposed as a result of manual loading and unloading, damage caused during upstream processes such as molding or base coating are often not identified until after metallization is complete. The delay in identifying damaged parts stems from the fact that metallizing exaggerates the presence of even small blemishes. As a result, parts that seem of acceptable quality after molding or base coating are often unacceptable after metallizing. Where large batch sizes are employed, large quantities of parts are placed at risk, and large quantities of scrap can result. Automating the handling of parts prior to metallization and eliminating conventional basecoats are two ways to minimize the amount of scrap.

In systems where rods are employed, the parts being processed are traditionally attached to a spindle, which acts as the connection between the rod and the part. To withstand the aggressive spinning of the painting processes and roller coaster upside-down spins of the traditional metallizing process, the connection between the spindle and the part requires a firm grip. However, this firm grip leads to several drawbacks. A firm grip on the parts can cause part distortion and subsequent fit and function issues. Engineering the appropriate firm grip increases the complexity and cost of the spindles. In addition, although the firm grip is required to ensure the parts are not dislodged during processing, a firm grip makes for more difficult hand-offs of the parts from molding to metallizing and from metallizing to final packout. Finally, in the event that the grip is not secure enough, parts will fall off spindles, which can cascade into a variety of inefficiencies and even consumer related issues.

Falling parts frequently result in mechanical issues. In addition, a common failure resulting from parts not being appropriately secured to the spindles is contamination of spindles coated without parts, whereby overspray can secondarily contaminate or otherwise affect the next part that goes on the un-cleaned spindle. These and other problems resulting from dislodged parts can have serious impacts on the quality of the end product and the performance of the metallizing system.

Significantly, traditional metallizing systems and methods lack the ability to fully integrate the molding and metallizing operations for small 3D parts. Metallizing systems specific to CD and DVD manufacturing did this 25 years ago, but such systems only apply metal coatings to a 2D surface and are not designed to apply a coating to 3D parts. Within the last decade, automotive companies started utilizing integrated metallizing and molding systems, but applications have been limited to large parts with low throughput rates.

None of the above existing devices, methods and systems, taken either singly or in combination, adequately address or resolve the aforementioned problems. Therefore, a need exists for a metallization device, method and system that provides reliable, high-speed metallization of a large volume of small parts.

SUMMARY OF THE INVENTION

The present invention solves the problems associated with metallizing small parts and provides an apparatus, method and system for applying a metal or metallic layer to small parts made from plastic, glass, composites, or other similar materials. The invention includes an apparatus for moving a plurality of parts in a metallizer. The apparatus includes a plurality of rotatable plates stacked vertically and spaced from one another, wherein each plate has an outer perimeter, a plurality of part supports arranged about the outer perimeter of each plate and one or more spindles arranged on one or more of the part supports, wherein each spindle is configured to removably retain thereon a part to be metallized, and wherein each spindle is configured to enable rotation of the part removably retained thereon. The plurality of part supports may be pins extending from the plate and arranged about the outer perimeter thereof. In one option, each spindle includes a drive ring configured to engage a drive system for causing rotation of the spindle on the pin. In another option, each pin includes a drive ring configured to engage a drive system for causing rotation of the pin and the spindle. Alternatively, the plurality of part supports may be clips extending from the plate and arranged about the outer perimeter thereof. Each spindle includes one or more grasping rings. The apparatus includes a plate support structure for supporting the plurality of plates in a vertical stack. The plate support structure may be a stack backbone and a plurality of stack support arms extending from the stack backbone and configured to support a corresponding number of the plurality of plates. The plate support structure may be a centered rod and the plurality of plates each has a center port through which the centered rod passes, the apparatus may further comprise couplings to couple the plates to the centered rod. The plate support structure may be in the form of a centered cylinder and the plate may be in the form of curved strips coupled to the plate support structure. The curved strip plates may be established as two or more segments and arranged about the plate support structure on substantially the same plane. The apparatus may further include a rotation unit arranged to cause rotational movement of the spindles on the plates. The rotation unit includes compliant drive fingers arranged for engagement of the rotation unit with the periphery of the spindles. The apparatus may further include a support frame, which is physically connected to the plate support structure. The support frame may include one or more rotation drive units arranged to cause rotational movement of the spindles or the part supports. The one or more rotation drive units each includes compliant drive fingers arranged for engagement of the rotation unit with the spindles or the part supports.

BRIEF DESCRIPTION OF THE DRAWINGS

These and other features, aspects and advantages of the present invention will become better understood with reference to the following description, appended claims, and accompanying drawings where:

DETAILED DESCRIPTION OF THE INVENTION

The device, method and system of the present invention allow users to metallize small parts with greater efficiency and at a throughput that is significantly higher than existing methods. Specifically, the present invention utilizes a stacked arrangement of parts, which are all rotated in a planetary manner during the metallizing process to ensure even and efficient coating.

Figure 1A:
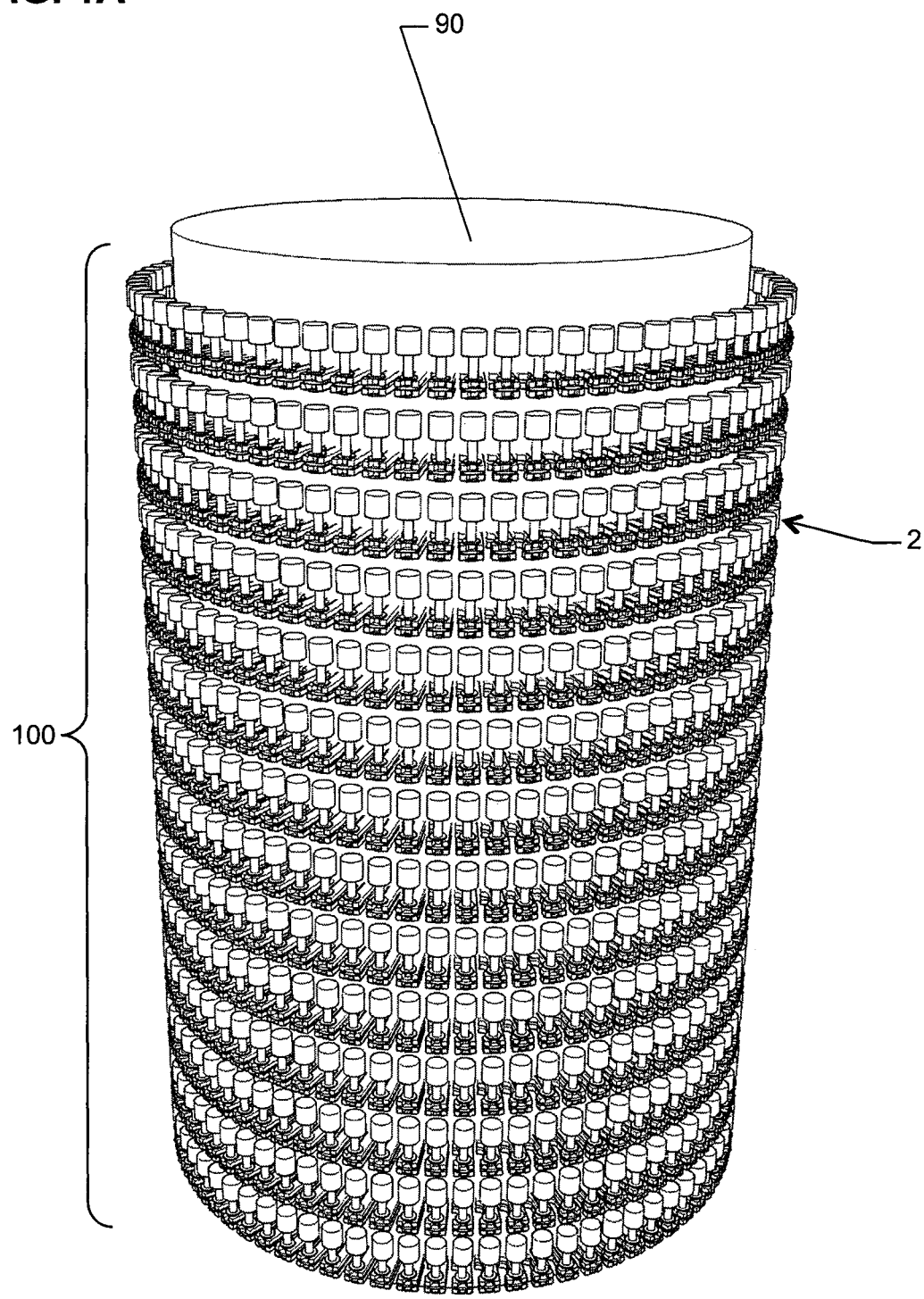
FIG. 1A shows a front view of a fixed stack.
Figure 1B:
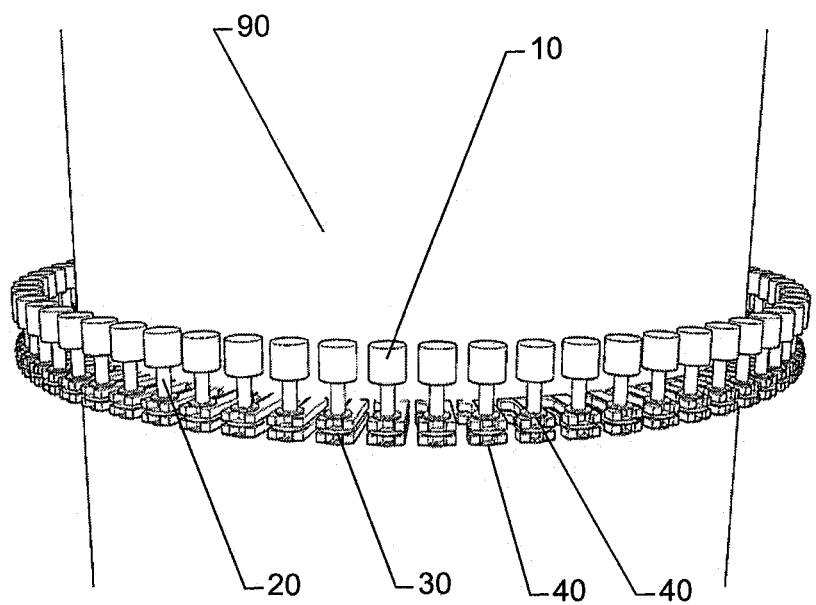
FIG. 1B shows a detail front view of one row of the fixed stack depicted in FIG. 1A.

As depicted in FIGS. 1A and 1B, the stack 100 of the present invention is defined based on the location of the parts 10 being metallized. The parts 10 are arranged in a series of substantially circular rows 2, whereby the entire stack 100 approximates the shape of a cylinder. The horizontal location of the parts 10 is set such that the axis of rotation for each part 10 is located at a substantially constant radius from the rotation axis of the entire stack 100. Preferably, the rows 2 are each arranged in a manner to ensure that the parts 10 will be equally distributed vertically in the coating space. While there may be some deviation in the vertical position of the parts 10, there must be consistency regarding the position of the vertical location of the drive rings 30 associated with each spindle 20. Specifically, the drive rings 30 in each row 2 must be at substantially the same vertical height, to ensure proper mating between the drive ring 30 and the rotation drive system. Where larger parts 10 are utilized, or where the invention is deployed for use in small metallizing chambers, there may be only one row 2 of parts 10.

Figure 2:
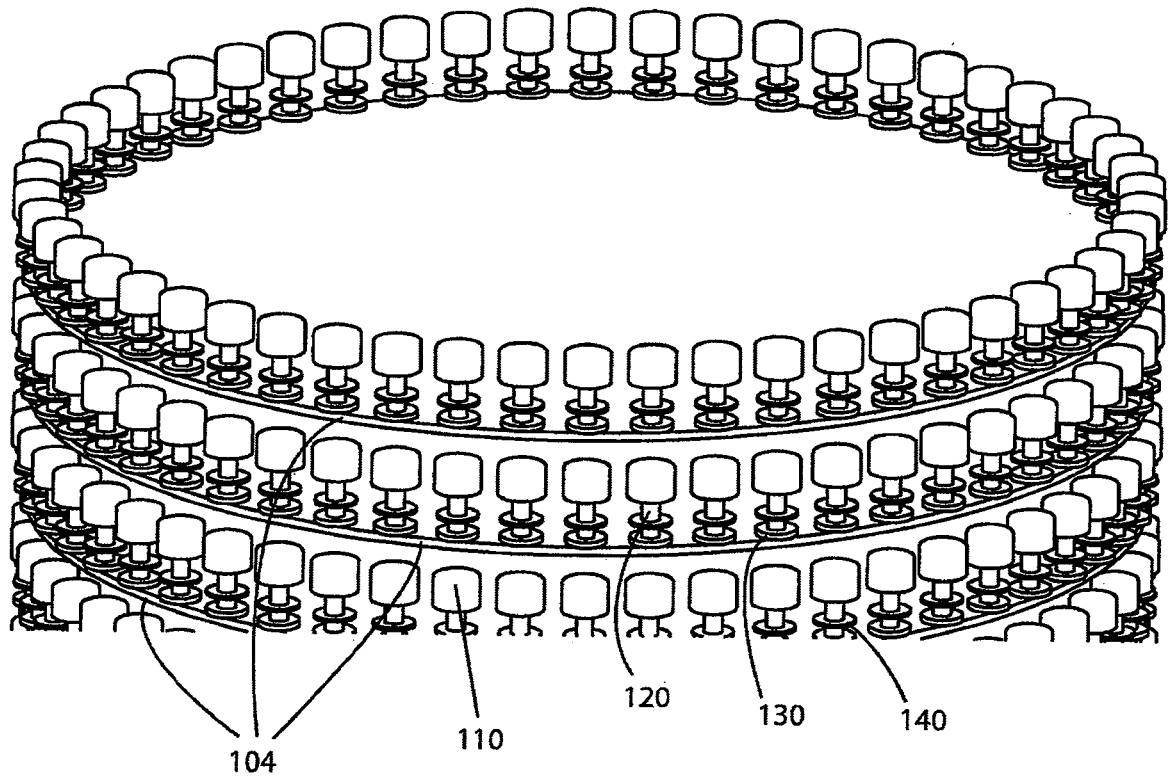
FIG. 2 shows a perspective view of the top of a stack of plates.
Figure 3:
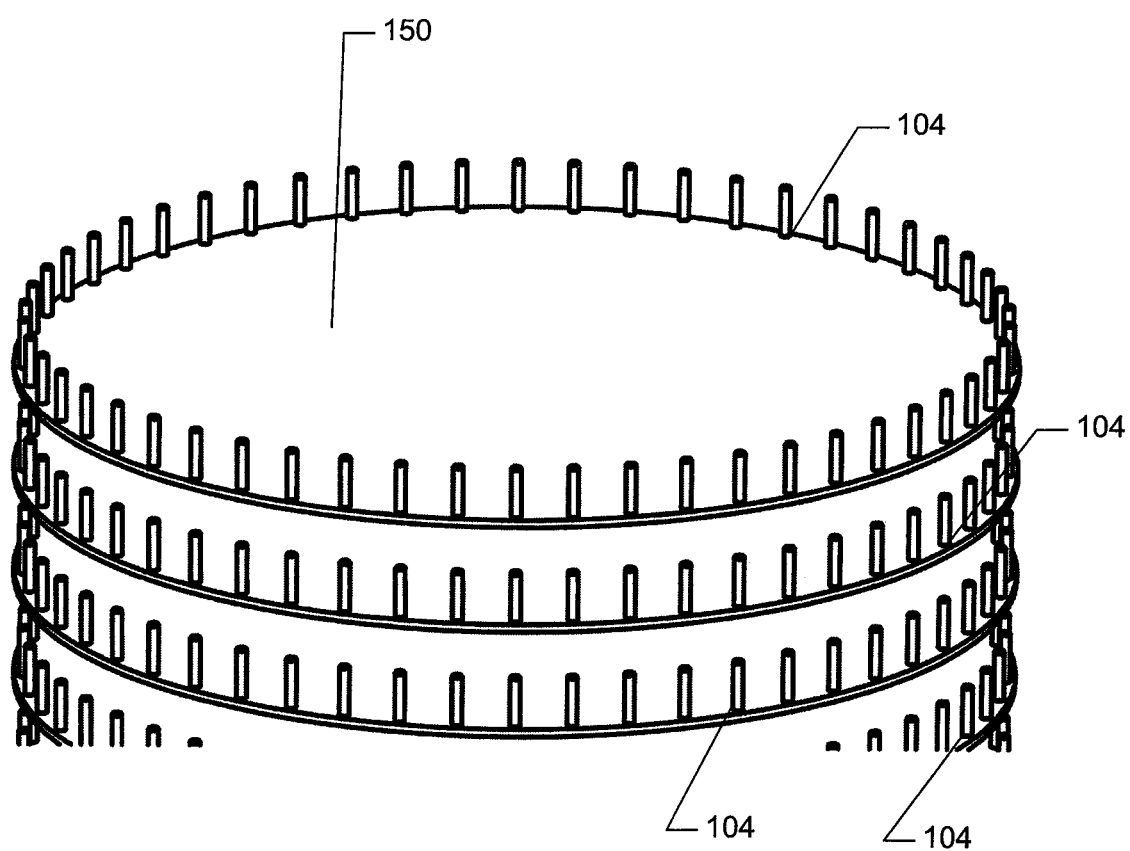
FIG. 3 shows a perspective view of the top of an unloaded stack of plates.

Turning to FIG. 2, the stack may be comprised of a plurality of plates 104 that are stacked vertically. Once stacked, the collection approximates a cylinder as shown in FIG. 1A. As depicted in FIG. 3, each individual plate 104 is substantially round with a plurality of pins 150 disposed near the circumferential outer edge of the plate 104. The plates 104 need not be solid and may be hoops, curved strips, or other forms that have a substantially round circumference. However, the plates 104 are made of a rigid material, such that they do not bend while parts are loaded and unloaded or while the plate stack is processed in a metallizing unit.

Figure 4A:
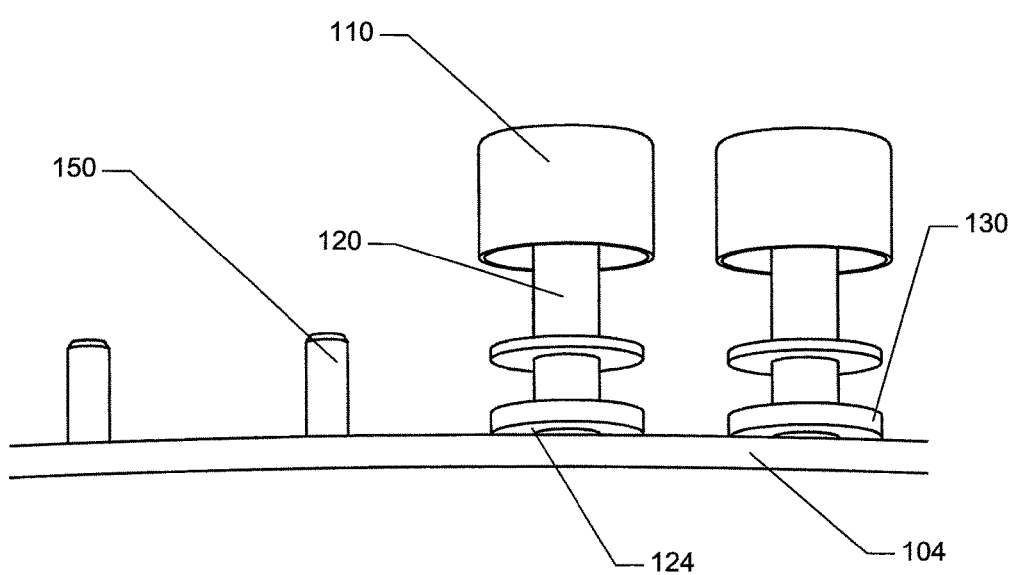
FIG. 4A shows a detail front view of a plate utilizing fixed pins in the loaded and unloaded state.
Figure 4B:
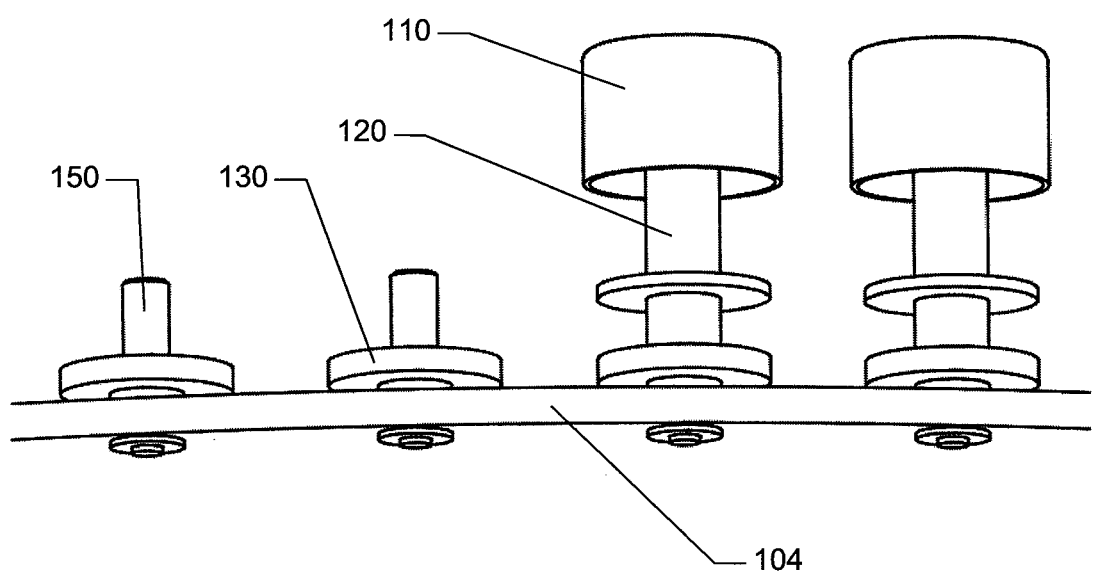
FIG. 4B shows a detail front view of a plate utilizing rotating pins in the loaded and unloaded state.

As depicted in FIG. 4A, the pins 150 may be affixed to the plate 104 such that the pins 150 cannot rotate or move in any way. This attachment can be done either through a press fit or through screwing, bolting, welding, or any other similar means. While the pins 150 are depicted as cylindrical, alternative shapes may be employed, provided the pins 150 are sized to accept and securely hold a spindle 120. Alternatively, as depicted in FIG. 4B, the pins 150 may be affixed to the plate in a manner that allows the pin 150 to rotate freely. In this embodiment, the pin 150 may simply fit in a hole in the plate 104, or it can utilize a bearing or a bushing to facilitate rotation.

The spindle 120 fits over the pin 150 via a hole in the spindle base 124. The depth of the hole in the spindle base 124 may vary based on the desired placement of the spindle 120. In instances where it is advantageous for the spindle 120 to rest directly on the plate 104, the hole in the spindle 120 is at least as deep as the height of the pin 150. Alternatively, where it is advantageous to suspend the spindle 120 such that the spindle base 124 is elevated above the plate 104, the hole in the spindle 120 is shorter than the height of the pin 150.

In embodiments where the plate 104 utilizes fixed pins 150, the spindles 120 fit loosely over the pins 150 in a manner that enables rotation of the spindle 120 about the pin 150. In embodiments where the plate 104 utilizes pins 150 that rotate freely, the spindle 120 is fit to the pin 150 in a manner that resists rotation of the spindle 120 about the pin 150, such that rotation of the pin 150 results in simultaneous rotation of the spindle 120.

Parts 110 are attached to the top of a spindle 120. The part 110 and spindle 120 are mated in a manner that gravity, friction, spring, or snap features prevent the displacement of the part 110 during transport and prevent the rotation of the part 110 about the spindle 120. The arrangement of spindles 120 and pins 150 permits the stack of plates and the parts 110 to rotate independently, creating a planetary movement of the parts 110, whereby the parts 110 rotate about their own axis while the entire circular array of parts rotates about the center of the stack.

Rotation of the parts 110 is accomplished through the incorporation of a drive ring 130. As depicted in FIG. 4A, the drive ring 130 may be located on the spindles 120, where the fixed pins 150 are employed. Alternatively, as depicted in FIG. 4B, the drive ring 130 may be located on the pins 150, where the pins 150 rotate freely. While FIGS. 4A and 4B each show the drive ring 130 as smooth, one will appreciate that the drive ring 130 may possess teeth, knurls, or other serrations to assist in the secure integration of the drive ring 130 and the rotation drive system. Preferably, the drive ring 130 will extend beyond the perimeter of the plate 104 to facilitate engagement with the rotation drive system.

Figure 5A:
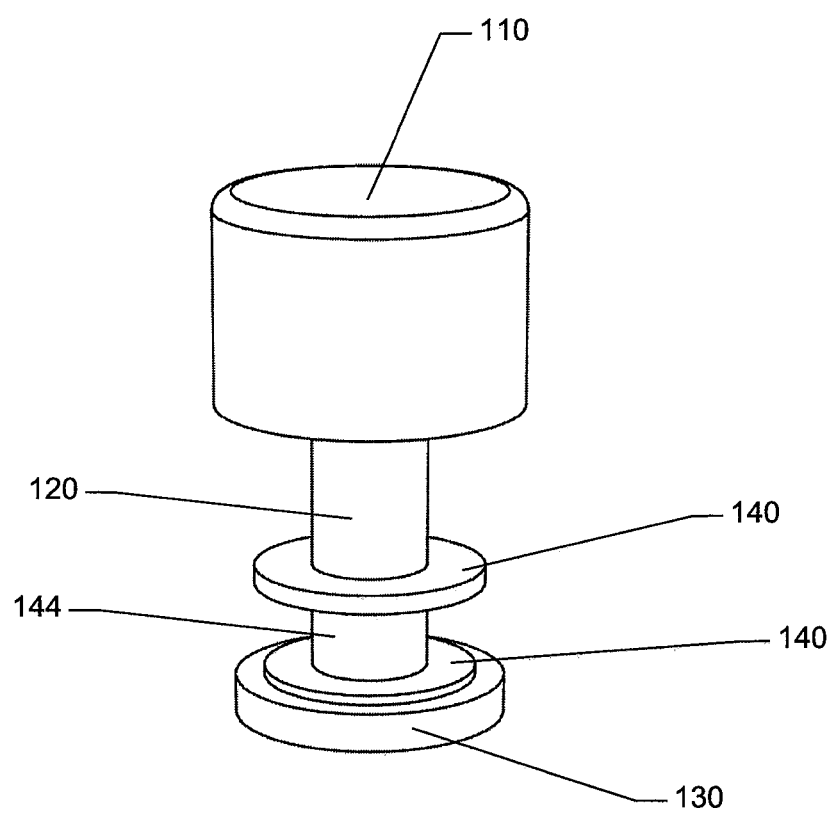
FIG. 5A shows a front view of a spindle loaded with a part.
Figure 5B:
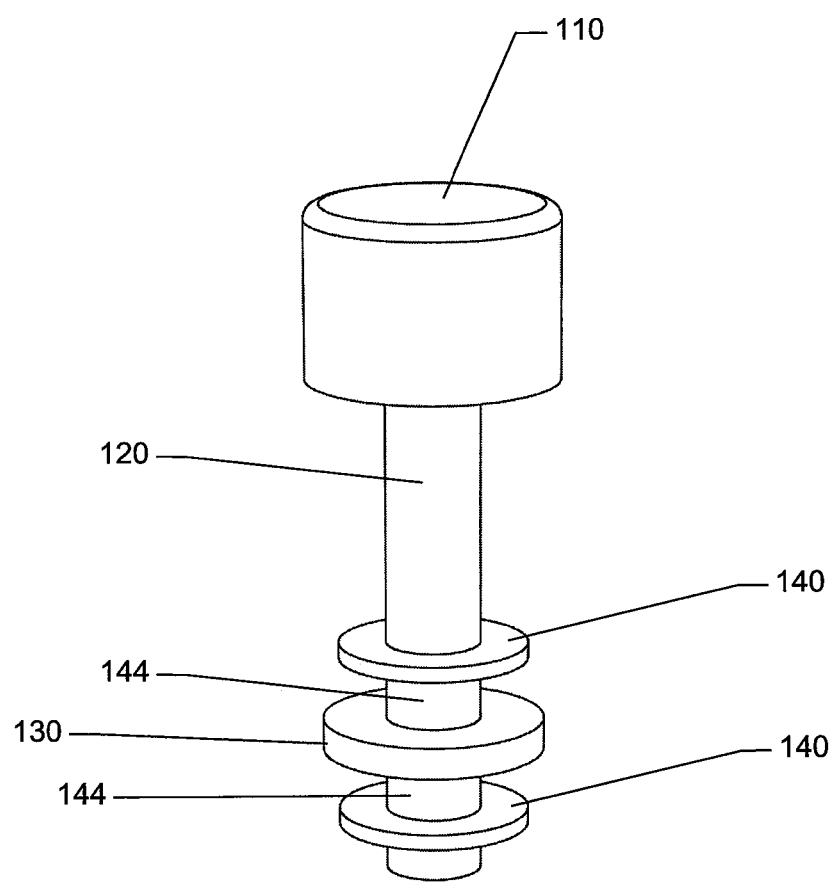
FIG. 5B shows a front view of a spindle loaded with a part.
Figure 5C:
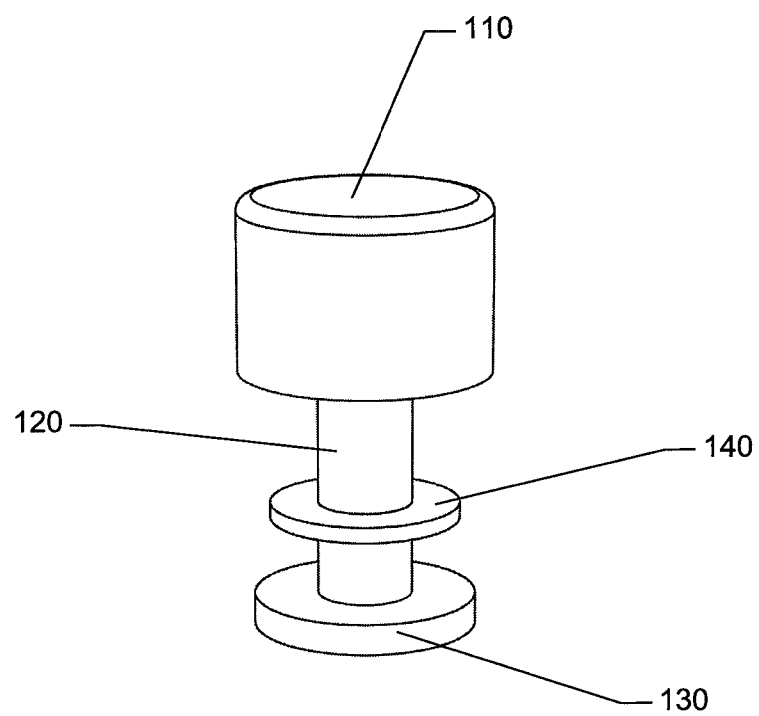
FIG. 5C shows a front view of a spindle loaded with a part.

Turning to FIGS. 5A, 5B and 5C, variations of the spindles 120 of the present invention are depicted. The spindles 120 incorporate one or more grasping rings 140 to facilitate manipulation of the spindles 120 by automated handling machinery. However, depending on the requirements of the automated handling machinery, the spindles 120 may utilize a pair of grasping rings 140 as depicted in FIGS. 5A and 5B, or the spindles can utilize a single grasping ring 140, as depicted in FIG. 5C. Where two grasping rings 140 are used, the two grasping rings 140 will usually define the upper and lower boundaries of a grasping zone 144. In this configuration, the top grasping ring 140 has the added benefit of shielding the grasping zone 144 from coating accumulation during processing. The grasping ring 140 may function only to facilitate handling or it may also function as a drive ring 130. Where the grasping ring 140 is utilized as a drive ring 130, the grasping ring 140 will preferably extend beyond the perimeter of the plate 104 and may possess teeth, knurls, or other serrations to assist in the secure integration with the rotation drive system. The spindles 120 depicted in FIGS. 5A, 5B and 5C, are by way of example only and it is expressly understood that the spindles 120 may utilize a different shape depending on the specific implementation and the grasping ring 140 and drive ring 130 will be positioned in a manner to facilitate integration with automated handling equipment and the rotation drive system.

In some embodiments, the plates 104 may utilize holes instead of pins 150 to hold the spindles 120. In these embodiments, the spindle base 124 includes a protrusion that can be inserted into the hole in the plate 104, thereby effecting a secure connection between the spindle 120 and the plate 104 and enabling the spindle 120 to rotate about its own axis.

Figure 6:
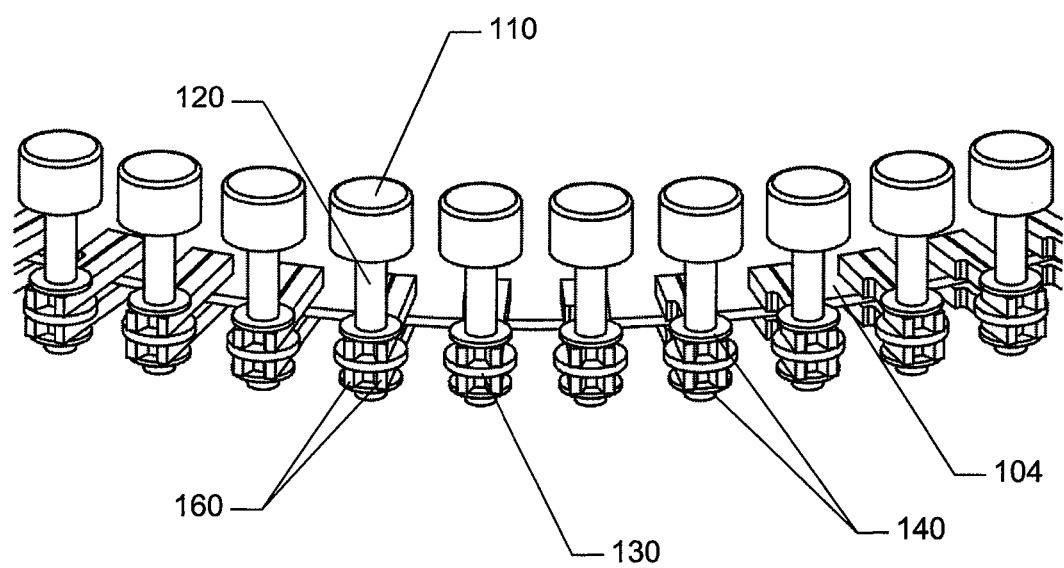
FIG. 6 shows a detail perspective view of a plate utilizing clips.

Turning to FIG. 6, the plates 104 may utilize clips 160 instead of pins 150 to hold the spindles 120. The clips 160 are designed to mate with the spindles 120 in a manner that securely holds the spindle 120, yet allows for rotation when the drive ring 130 is engaged by the rotation drive system. While the clips 160 shown in FIG. 6 extend beyond the perimeter of the plate 104, the clips may be positioned in any manner that allows proper alignment of the parts 110. For example, the plates 104 may include a cutout, and the clips 160 may be positioned such that the spindle 120 is held by the clips 160 at a position analogous to the position of the pins 150. Preferably, a clip 160 is positioned above and below the plate 104, with the drive ring 130 located between the clips 160 once the spindle 120 is inserted into the clips 160. However, clips 160 may also be attached such that they are positioned entirely above or entirely below the plate 104. Regardless of the positioning of the clips 160 with relation to the plate 104, however, preferably, the drive rings 130 extend beyond the perimeter of the plate 104 to ensure proper engagement with the rotation drive system.

Figure 7A:
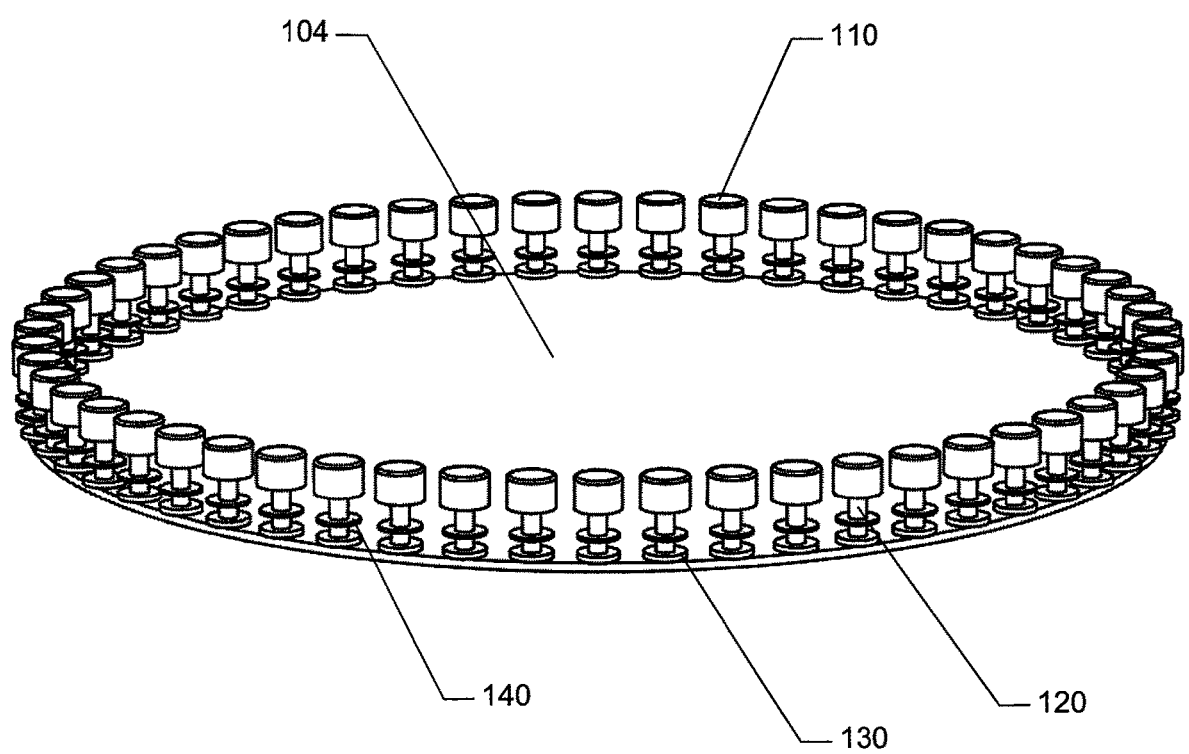
FIG. 7A shows a perspective view of a plate loaded with parts.
Figure 7B:
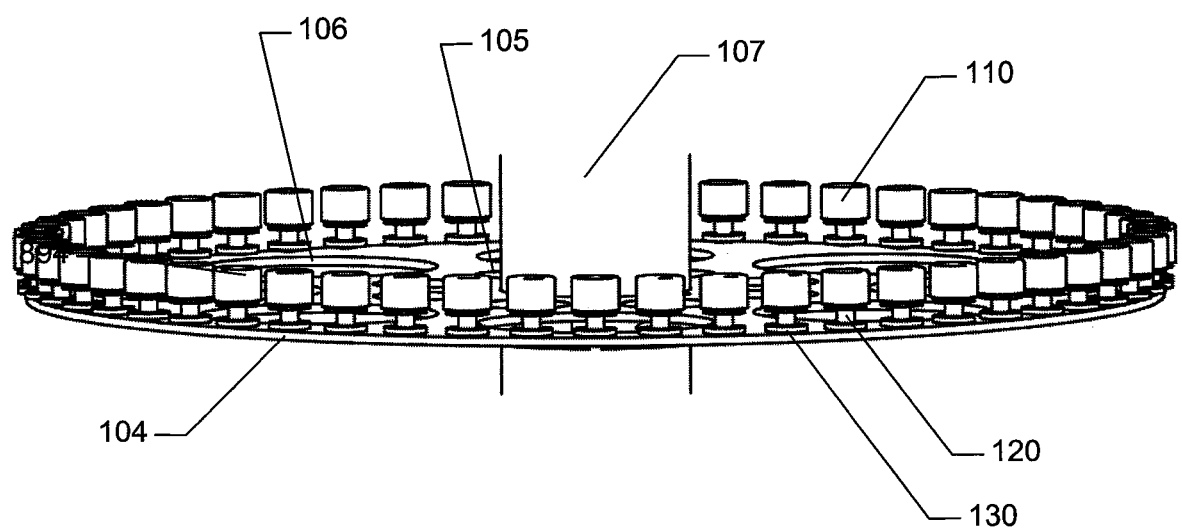
FIG. 7B is a top perspective view of an embodiment of a portion of the apparatus having a centered rod to which the stack of plates may be coupled.
Figure 7C:
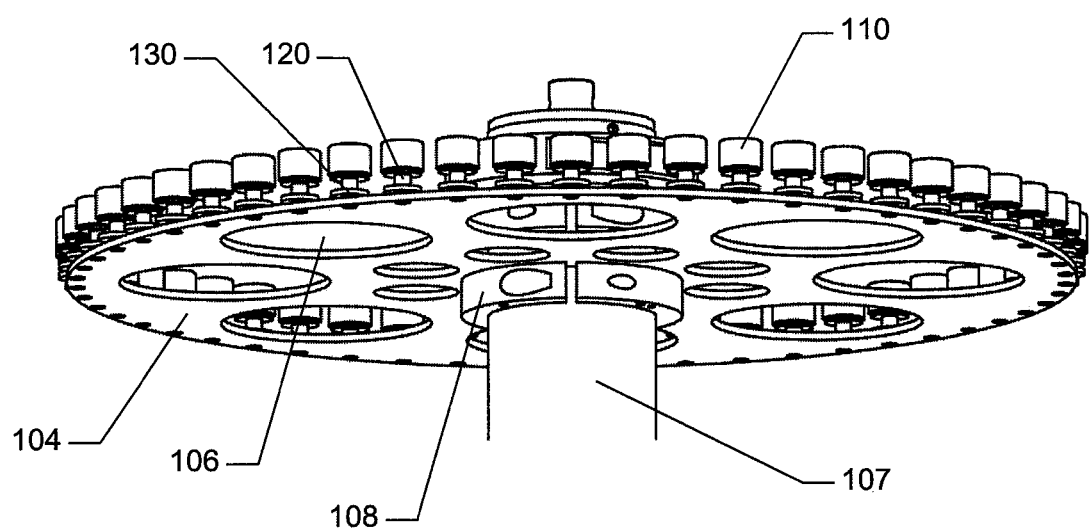
FIG. 7C is a bottom perspective view of the apparatus portion of FIG. 7B.

FIG. 7A shows parts 110 loaded onto spindles 120 and multiple spindles 120 loaded onto a plate 104 in preparation for metallizing. Parts 110 are positioned around the circumference of the plate 104 and the plate 104 is then stacked with other plates 104 in a vertical arrangement. The number of plates 104 needed to create a full stack can vary. While the vertical height of the parts 110 being metallized and the size of the metallizing chamber determine the maximum number of plates 104 that may be stacked, in some instances it may be advantageous to utilize fewer plates 104 in a stack. Preferably, the plates 104 are arranged in a manner to ensure that they will be equally distributed vertically in the coating space. FIGS. 7B and 7C show an alternative version of each plate 104, which includes a center port 105 and a plurality of cutouts 106. The apparatus includes a centered rod 107, which passes through the center ports 105 of the plates 104. The centered rod 107 is coupled to an actuator arranged to cause rotation of the centered rod 107. The apparatus of FIGS. 7B and 7C further includes for each plate 104 a coupling collar 108 affixed to an underside of the plate 104 and arranged to engage with the centered rod 107 to removably retain the plate 104 on the centered rod 107 in a selectable position to permit stacking of the plates with sufficient spacing for parts placement thereon. The cutouts 106 are optional and may be incorporated to reduce the weight of the plate 104 and, therefore, the overall weight of the apparatus.

Figure 8A:
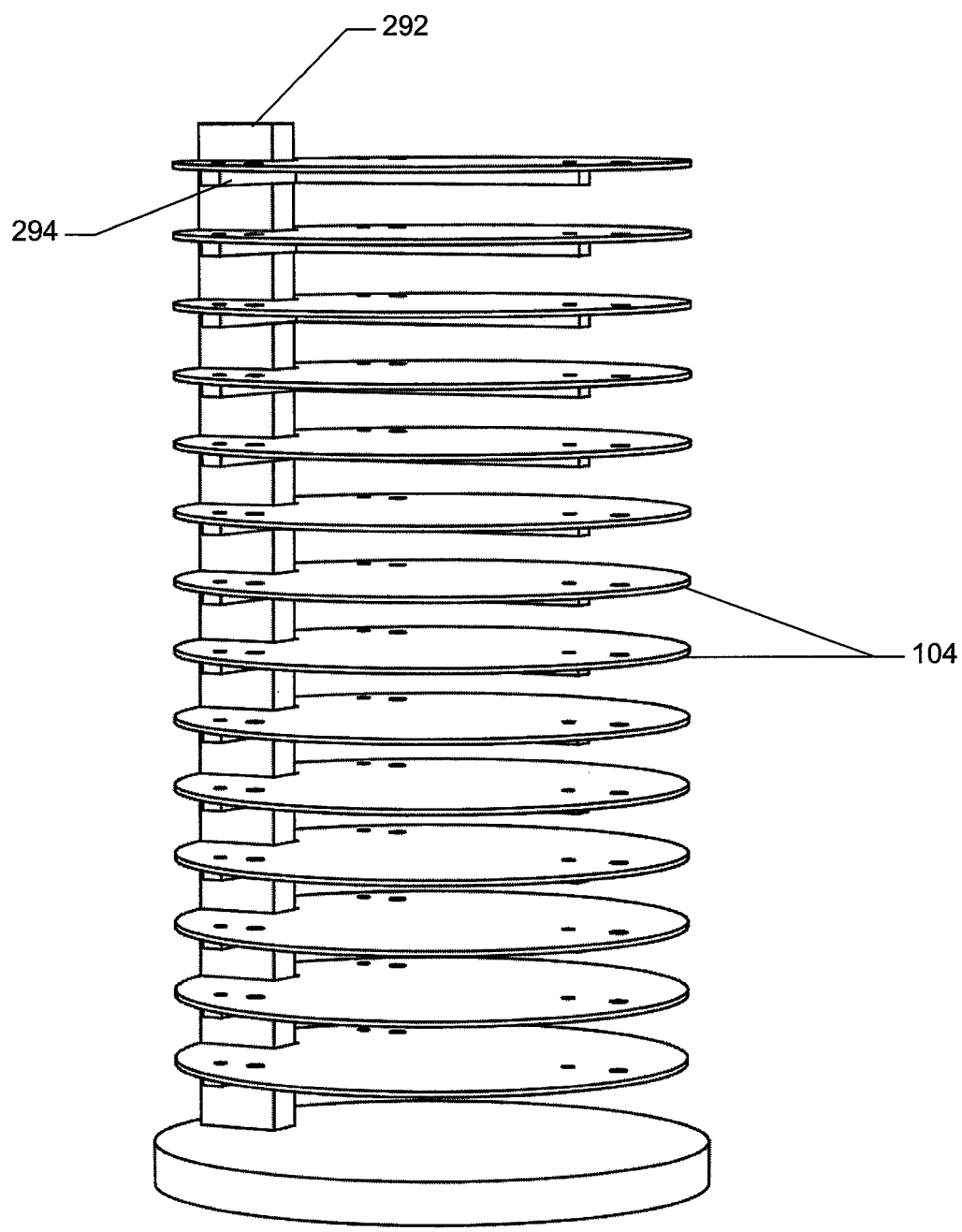
FIG. 8A shows a side view of a separable stack.
Figure 8B:
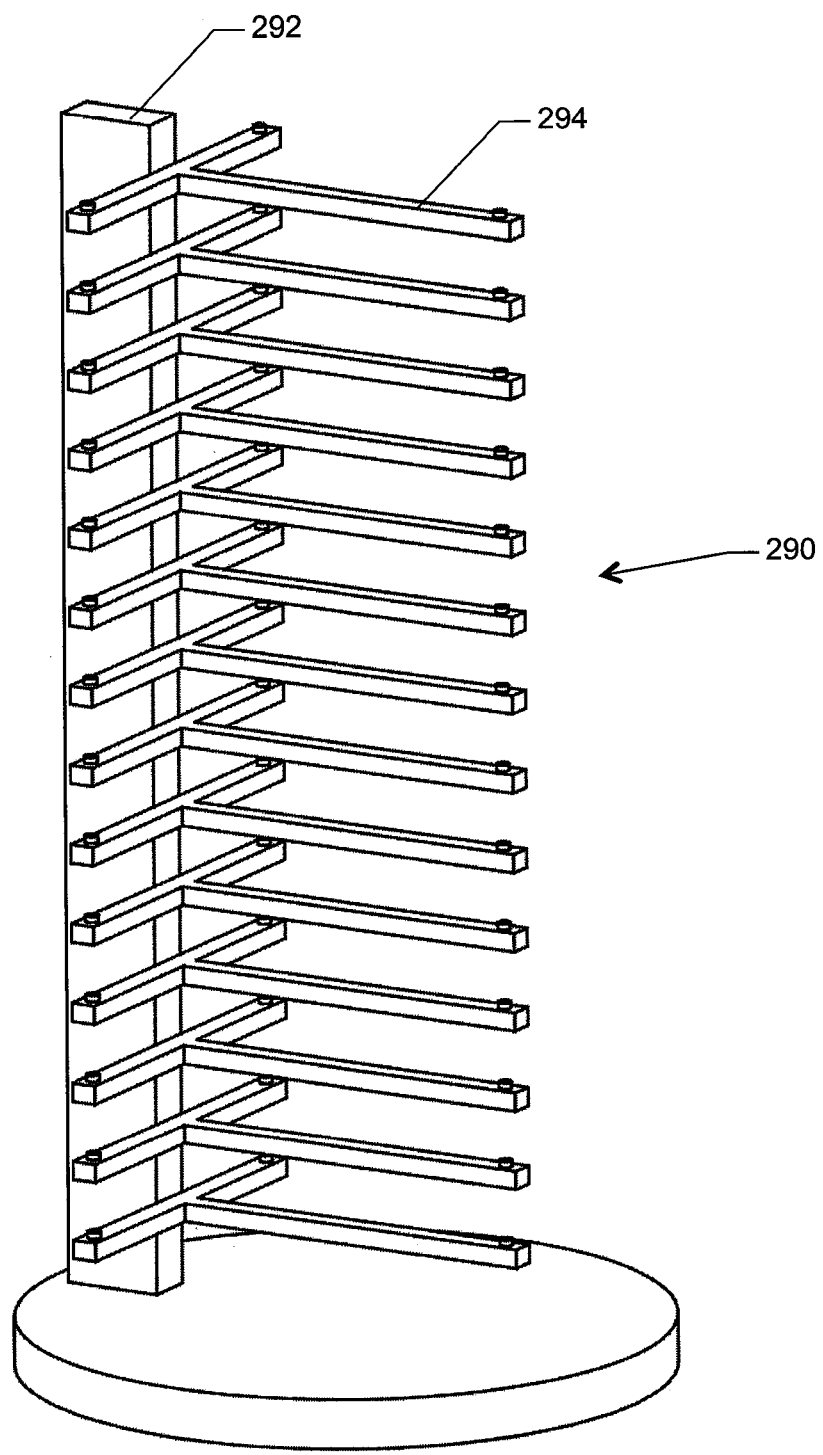
FIG. 8B shows a side view of a support structure.

Plates 104 may be assembled into a fixed stack, where the stack is assembled in a manner such that the individual plates 104 may only be removed by express disassembly. Alternatively, as depicted in FIGS. 8A and 8B, individual plates 104 may be separable from the stack to facilitate transport of the plates 104 during the loading and unloading process. In both instances, the stack is supported by a support structure 290 and the plates 104 are held securely in place such that the entire stack may be rotated as a cohesive unit.

Figure 9:
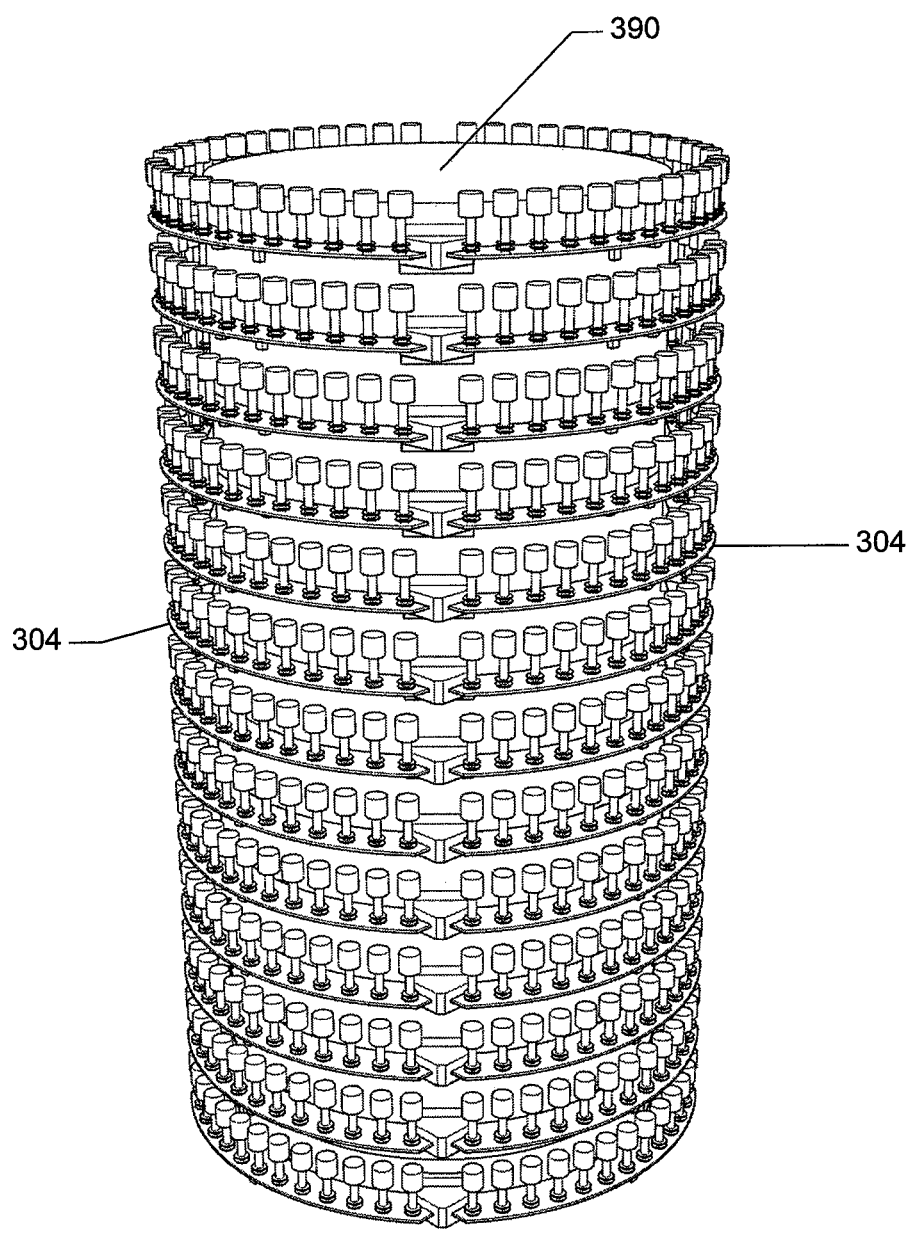
FIG. 9 shows a front view of a fixed stack.

As depicted in FIG. 8B, a separable stack support structure 290 may utilize a stack backbone 292 and plate mounting arms 294, which are structurally sound for the loads they will bear. The support structure 290 may also be adapted to create a fixed stack such that the plates 104 are fixedly attached to the stack backbone 292, to the plate mounting arms 294, or both. FIG. 9 depicts an alternative arrangement, where the fixed stack utilizes plates 304 in the form of curved strips attached to a solid support structure 390. In addition to these specific examples, additional possibilities known to one of skill in the art for supporting the plate stack of the present invention will determine the specific implementation based on the style of plate used and the preference for a fixed or a separable stack.

Returning to FIGS. 1A and 1B, the stack may not utilize plates at all. Instead, the stack may be created by arranging the parts 10 around the support structure 90. FIG. 1B depicts clips 160 attached directly to the support structure 90 as the means for holding spindles 20 and parts 10 in correct alignment. One will appreciate that there are other similar methods for securing spindles 20 such that the parts 10 being metallized form a substantially cylindrical stack. For example, pins may be used in place of clips 160 either by adapting the pin to attach directly to the support structure 90, e.g., using pins with a 90-degree bend, or by adapting the support structure 90 to provide an attachment point for the pins such that the pins are oriented substantially vertically.

Figure 10:
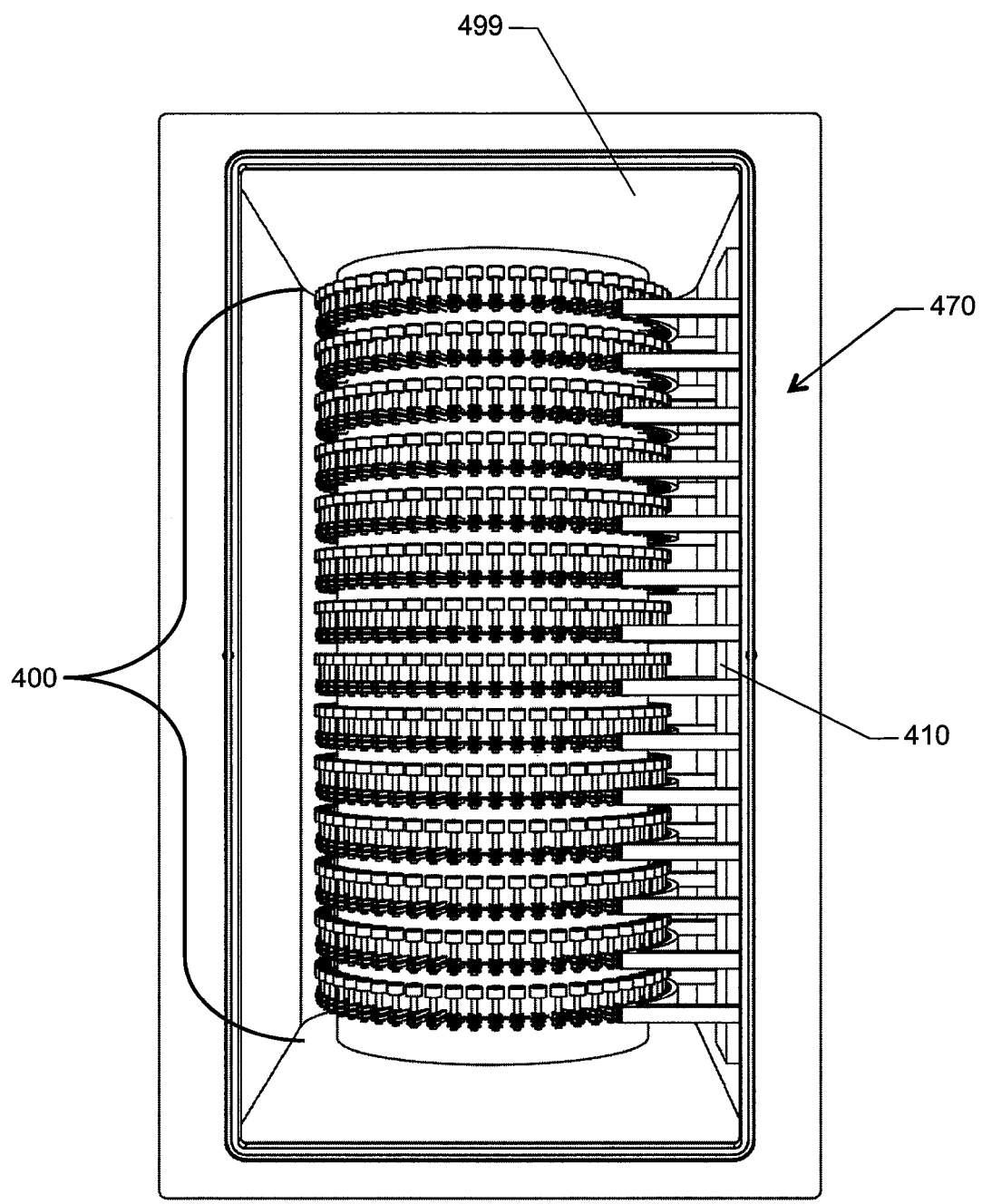
FIG. 10 shows a front view of a stack located inside a metallizer chamber.

Turning to FIG. 10, during metallization, the stack 400 is inserted into a metallizing chamber 499. During metallization, the entire stack 400 is rotated about its axis, while the parts 410 are each rotated about their individual axes. To achieve the planetary motion of the parts 410, the metallizing chamber is fitted with a rotation drive system that comprises a static rotation unit 470.

Figure 11:
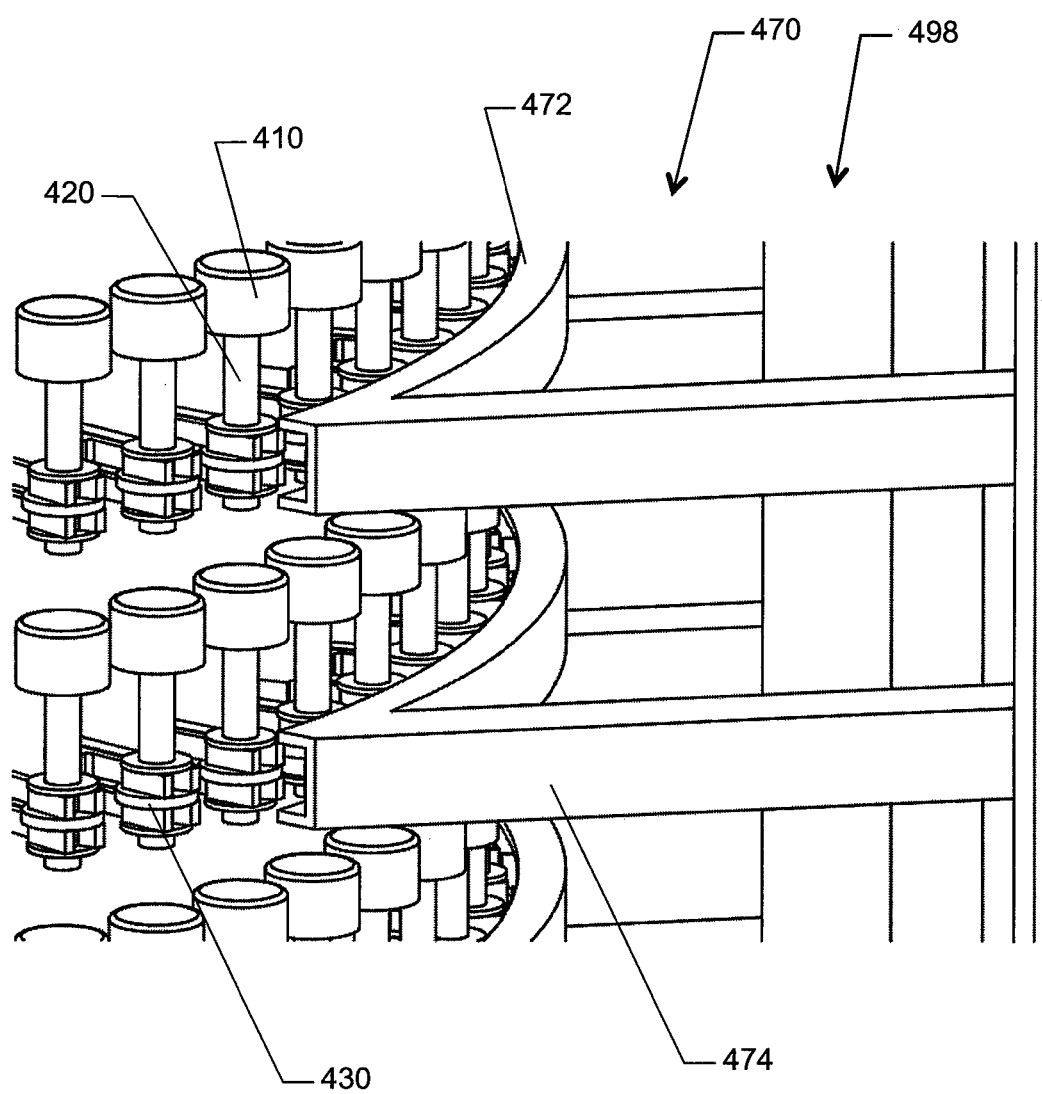
FIG. 11 shows a side view of the static rotation unit.

Turning to FIG. 11, the static rotation unit 470 comprises a series of compliant drive fingers 472 and a mounting bracket 474. The compliant drive fingers 472 are arranged in an arc with a radius approximately the same as the outer radius of the stack 400. To ensure even coating, part 410 rotation is required while the parts 410 pass through the process zone of the metallizer. Therefore, the compliant drive fingers 472 are arranged throughout the process zone, which is located in front of the coating source 498. While the compliant drive fingers 472 may extend beyond the process zone, part 410 rotation out of the process zone causes needless frictional resistance to rotation of the entire stack 400. Preferably, there is a sufficient number of compliant drive fingers 472 in front of the coating source 498 to provide at least one full rotation of each part 410 as the spindle 420 passes through the process zone.

The mounting bracket 474 shields the compliant drive fingers 472 and the drive rings 430 from coating deposition and from thermal energy during the metallizing process. While the mounting bracket 474 is not required, its use reduces the need to clean the compliant drive fingers 472 and minimizes the risk that the compliant drive fingers 472 will lose functionality as a result of constant bombardment from coatings during the coating process. Further, thermal energy accumulation on components in vacuum can result in high temperatures. Shielding reduces the resulting temperatures.

Figure 12:
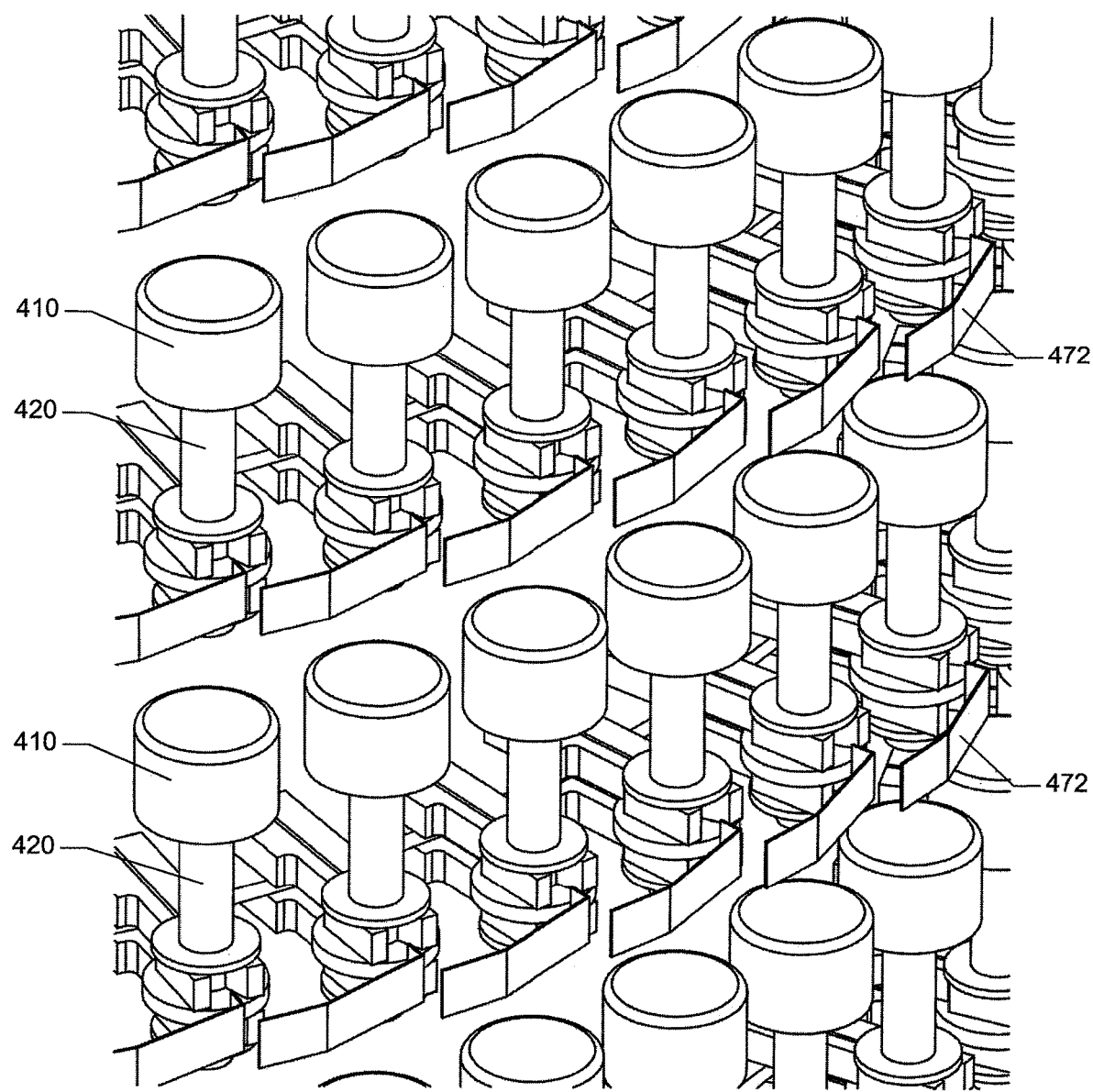
FIG. 12 shows a perspective view of the static rotation unit with the mounting brackets removed.

FIG. 12 depicts the compliant drive fingers 472 with the mounting bracket 474 removed. The compliant drive fingers 472 rotate the parts 410 by engaging with the drive ring 430. Rotation of the stack 400 causes the parts 410 to move through the coating zone. As the parts 410 move through the coating zone, the free ends of the compliant drive fingers 472 engage with teeth, knurls, or other serrations located on the periphery of the drive ring 430, causing the spindles 420 and the attached parts 410 to rotate as they traverse the arc in front of the coating source 498.

The compliant drive fingers 472 are compliant to tolerate stack 400 misalignment due to tolerance accumulation or an out of specification condition. These misalignments can be either vertical or radial and are particularly important to account for in the metallization process given that the parts cannot be seen in that area of the metallizing chamber. As shown in FIG. 12, the compliant drive fingers 472 can be implemented as leaf springs, enabling a significant acceptance window in which proper functioning occurs. However, a person of skill in the art will readily appreciate that the compliant drive fingers may also be implemented through any type of spring-loaded system or other compliant means. For example, a friction-based rub surface or a simple brush type system could perform a similar compliant drive function.

In some embodiments of the present invention, there may be multiple process zones to allow for the application of multiple coatings. For example, the metallizing chamber may be configured to apply a basecoat and or a topcoat in addition to depositing the desired metal or metallic layer. In these instances, there must be sufficient complaint drive fingers 472 to ensure that the spindles 420 are rotated in each process zone. Preferably, there is a sufficient number of compliant drive fingers 472 to provide at least one full rotation of each part 410 as the part 410 passes through each process zone.

While the stack of the present invention has the ability to significantly increase the processing rates for coating parts using a standard metallizer chamber, integrating the stack and rotation drive system of the present invention into an in-line metallizing system has the ability to substantially increase the production rate for metallizing parts compared to traditional in-line metallizing methods. For example, based on existing metallizer cycle times, the present invention has the ability to process more than 13,000 parts per hour, a production rate greater than currently available in-line metallizing alternatives by approximately a factor of four for similarly sized parts.

In-line systems of the present invention may utilize a puck-style asynchronous conveyor to move parts between processing stations, one of which is the metallizer station. Additional available processing stations may include base coating, top coating, laser marking, inspection, component assembly, as well as others, depending upon the specific need. Processing stations either stop the conveyor in a known location for subsequent processing or perform a process while parts are in motion. The stop version of processing station, which utilizes the conveyor to move parts between processing locations and then stops at a known location for processing, could include loading parts on spindles at the molding machine, embossing, printing, laser marking, loading and unloading the stack of plates, or metallizing. The moving version of processing station, which utilizes the conveyor to moves parts through the processing station at established rates for effective processing, could include painting, solvent flashing, curing, laser marking, or surface pre-treatment.

The metallizing station is central to the in-line systems of the present invention and comprises a load point, which serves as an interface to the conveyor, loading robotics, which load and unload parts to and from the plate stack, and a metallizer. Additionally, in some embodiments of the system of the present invention the metallizing station includes specific design features incorporated into the metallizer to provide for satisfactory operation of all metallizing and coating processes in situ within the metallizer.

The part vulnerability window, which opens upon mold exit and closes upon completion of all coating and metallizing processes, is understood as the period of time where parts are most susceptible to damage. During the entire part vulnerability window, parts can be easily damaged from dust, abrasion, human handling and many other factors. In typical batch oriented systems, parts have a significant part vulnerability window that can last many hours, and at times even much longer. The in-line systems of the present invention, however, reduce the part vulnerability window to just a few minutes.

Figure 13:
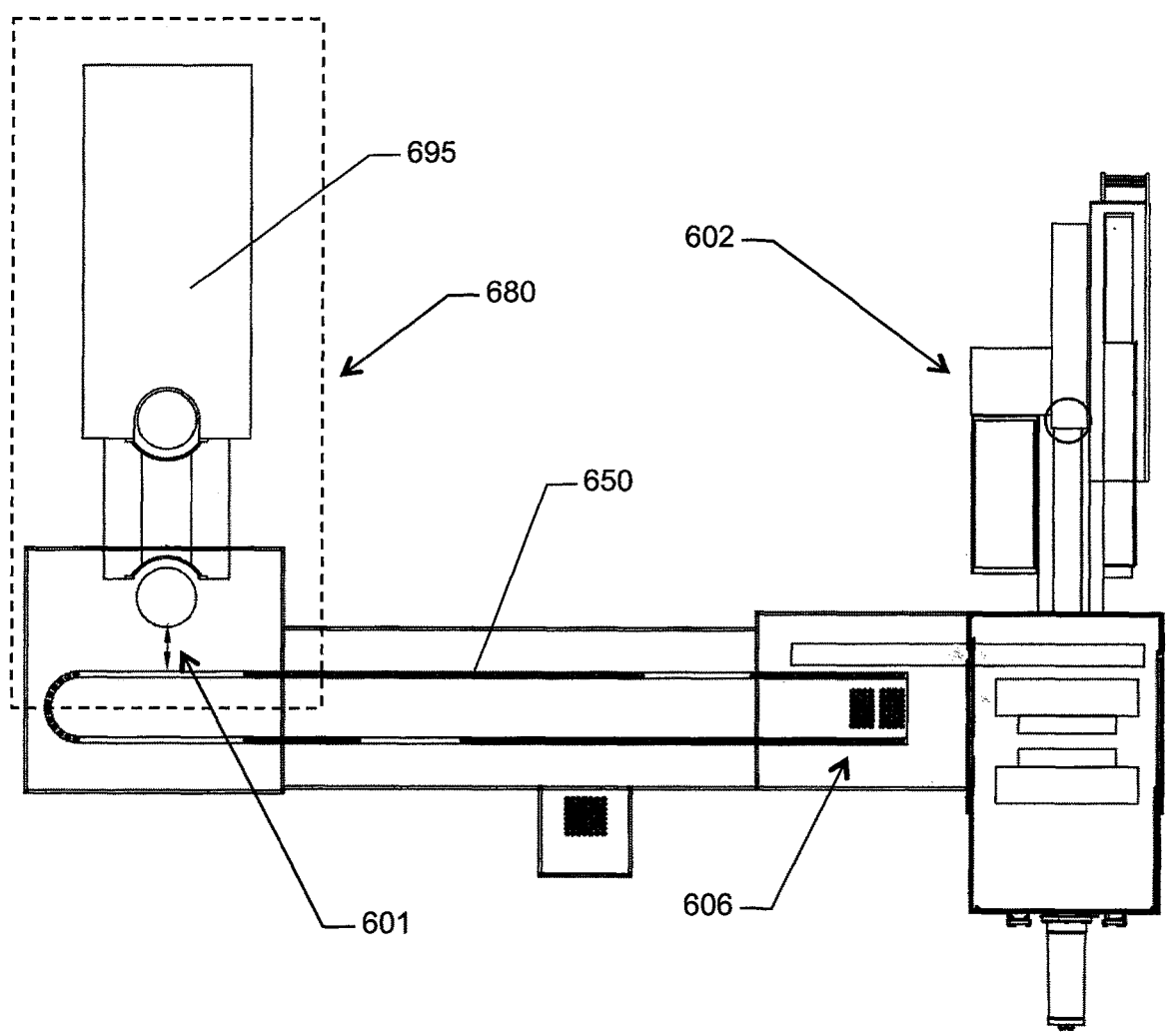
FIG. 13 shows a plan view of an in-line metallizing system.
Figure 14A:
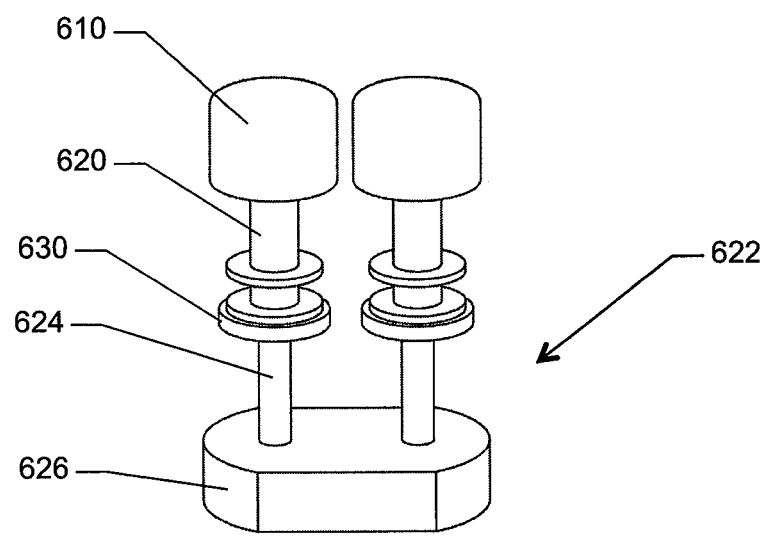
FIG. 14A shows a front view of a conveyor puck utilizing fixed pins.
Figure 14B:
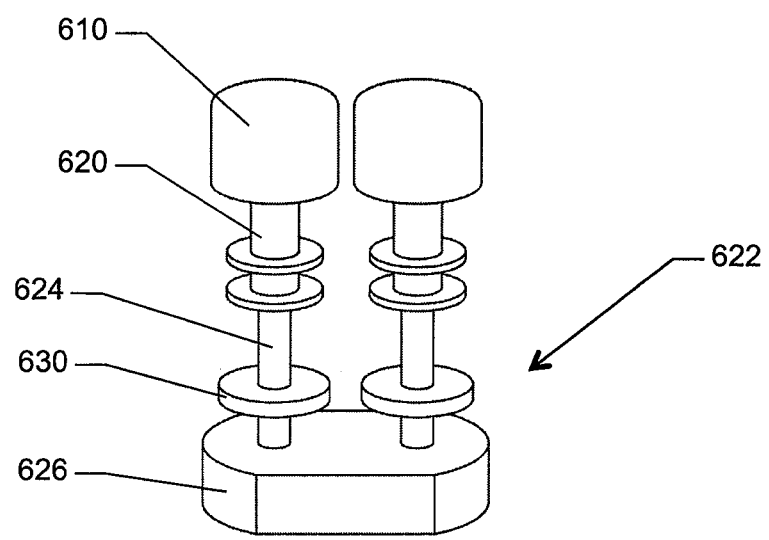
FIG. 14B shows a front view of a conveyor puck utilizing rotating pins.

Turning to FIG. 13 the system of the present invention may incorporate an injection molding machine 602 and a metallizer 695 interconnected via a conveyor 650. In this configuration, a mold take-out robot, which is customarily included with the injection molding machine 602, places parts onto a conveyor puck at the puck loading station 606 for transport to the metallizing station 680 for in-line processing. As depicted in FIGS. 14A and 14B, the conveyor puck 622 comprises a stabilizing base portion 626 that is adapted to accept one or more product specific spindles 620. Since the conveyor puck 622 is a transport mechanism for the spindles 620, the conveyor puck 622 utilizes pins 624 or other protrusions designed to securely hold the spindles 620. To ensure smooth operation of the system, the conveyor puck pins 624 mimic the plate 104 pins 150. Similar to the plate 104 pins 150, the conveyor puck pins 624 may be fastened to the conveyor puck 622 in a manner that prohibits conveyor puck pin 624 rotation or the conveyor puck pins 624 may be fastened to the conveyor puck 622 in a manner that permits the conveyor puck pins 624 to rotate about their own axes. Alternatively, where the plates 104 utilize a hole rather than a pin 150, the conveyor puck 622 may utilize a hole to accept a protrusion in the base portion of the spindle 620.

The conveyor pucks 622 depicted in FIGS. 14A and 14B are shown with two conveyor puck pins 624, each conveyor puck pin 624 is adapted to securely hold a spindle 620. Utilizing two conveyor puck pins 624 per conveyor puck 622 presents certain advantages relative to reduced complexity and machine component count reduction and improves conveyor puck 622 stability during transport on the conveyor 650. However, the double-pin conveyor puck design is but one means to accomplish part transfer. The same could be accomplished where each conveyor puck 622 utilizes a single conveyor puck pin 624 or where each conveyor puck 622 utilizes more than two conveyor puck pins 624. Further, multiple conveyor pucks 622 can be assembled together forming a chain segment of conveyor pucks 622 that is capable of bending and conforming as needed to straight and curved regions of the conveyor 650, the puck loading station 606 and the metallizing station 680. Alternatively, it is possible to forgo the use of conveyor pucks 622 altogether and form a chain of pins mounted to a flexible spline. As with the chain of conveyor pucks 622 previously described, the flexible spline would bend and conform as needed to straight and curved regions of the conveyor 650, the puck loading station 606 and the metallizing station 680.

Before the conveyor pucks 622 reach the molding machine load point 606, the conveyor puck pins 624 are holding spindles 620 that are empty, i.e., the spindles 620 are not loaded with parts 610. At the molding machine load point 606, the conveyor pucks 622 and empty spindles 620 are arranged in a two-dimensional array such that the molded parts 610 are placed on the spindles 620 by the molding machine robot or other related device. The parts 610 remain on the spindles 620 throughout the coating process, with the part 610 and spindle 620 mated in a manner that gravity, friction, spring, or snap features prevent the displacement of the part 610 during transport and prevent the rotation of the part 610 about the spindle 620.

As depicted in FIG. 14A, where fixed conveyor puck pins 624 are utilized, a drive ring 630 is located on the spindles 620, while, as depicted in FIG. 14B, in embodiments where the conveyor puck pins 624 rotate freely, a drive ring 630 may be located directly on the conveyor puck pins 624. This arrangement mirrors the arrangement depicted in FIGS. 4A and 4B and permits an assembly of spindles 620 atop of conveyor puck pins 624 and parts 610 atop of spindles 620, such that the parts 610 can rotate as they pass through processing stations such as paint booths, cure stations and other processing stations.

While multiple methods of rotating parts 610 on a conveyor 650 are known in the art, one popular method is the use of one or more drive chains that are either fixed in place or actuated in either the forward or reverse direction. Drive chains may be arranged to interface with the conveyor pucks 622, causing rotation of the conveyor puck pins 624, spindles 620 and parts 610 as needed for the specific process performed as the parts 610 pass through a specific processing station. Preferably, the drive chain is actuated to provide control over the rotation speed of the parts 610 during processing. Examples of alternatives the drive chain include, a cogged belt, a smooth belt, or one or more rubberized cords.

It is sometimes advantageous to align the parts 610 in a specific angular orientation. As is known in the art, there are several methods to ensure proper angular orientation of parts 610. One such method is the use of a D-shaped collar or ring. In systems of the present invention where proper angular orientation of the parts 610 is required, preferably a D-shaped collar or ring attached to either the spindle 620 or the conveyor puck pin 624 to contact a bar as the conveyor travels, however, other methods known to persons of skill in the art may also be utilized to achieve proper angular orientation.

The conveyor 650 transports conveyor pucks 622, which have been loaded with spindles 620 and parts 610 to the metallizing station 680 as previously described. When the conveyor pucks 622 reach the load point 601, the conveyor pucks 622 are preferably arranged in a substantially circular arc in preparation for transfer of the spindles 620 to the stack. Once arranged, an automated handling device picks the spindles 620 from the conveyor pucks 622 and transfers the spindles 620 as described in more detail below.

In one embodiment of the present invention, all coating processes, including base coating, PVD, and top coating are applied in-situ at the metallizer 695. Upon metallizer exit, parts 610 are complete. In this embodiment of the present invention, process consumables are minimized and capital cost per part is at its lowest, creating a fully integrated process where parts 610 are metallized shortly after molding with only a few minutes of latency time and a very short part vulnerability window. As a result, defects associated with molding are evident immediately after metallizing and the number of parts 610 at risk is minimized.

The metallizer 695 of the present invention is a vacuum metallizer. Appropriate metallizers are produced by multiple companies worldwide for depositing metal and other types of coatings to a multitude of parts. Metallizers compatible with the present invention possess one or more coating zones within the process chamber depending upon their configuration. During metallization, parts 610 move about each coating zone as the coatings are applied. A common size for the process chamber of the metallizers compatible with the present invention is a coating volume of 28 inches in diameter and 48 inches in vertical height (28×48). However, one will appreciate that the present invention can utilize metallizers with process chambers with larger or small coating volumes by adapting the dimensions of the stack.

Figure 15:
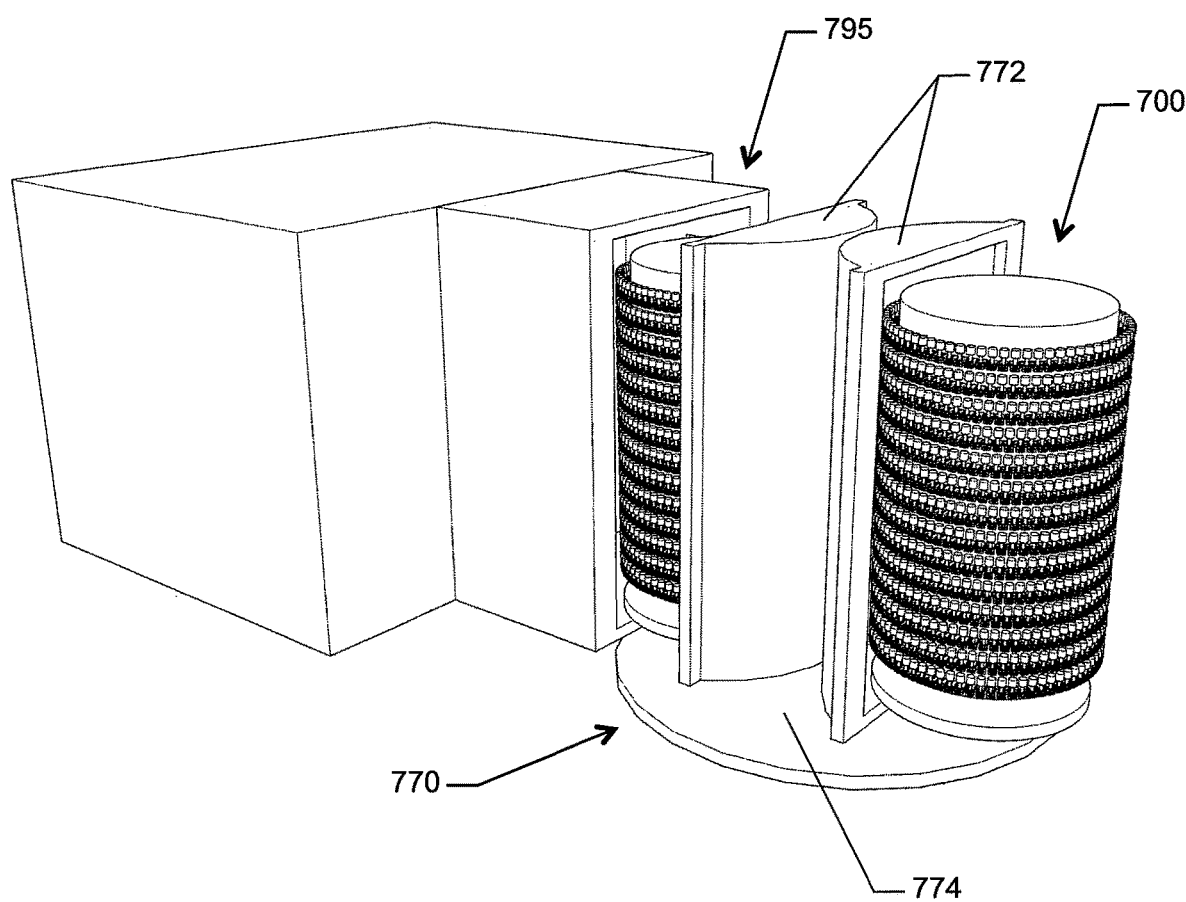
FIG. 15 shows a perspective view of one form of single point loader utilizing two stacks.

The metallizer 695 may incorporate a single point loader 770 as depicted in FIG. 15. The single point loader 770 is an add-on option provided by the metallizer manufacturers and consists of two single point loader doors 772 mounted on a 180-degree rotating platform 774. When one loader door 772 is sealed in place on the metallizer 795, forming the fully enclosed process chamber, the other loader door 772 is available for loading and unloading a stack 700 at the 180-degree position.

Basecoats may be applied prior to metallization for surface remediation and adhesion, and topcoats may be applied after metallization for metal layer protection, colored tints, and surface effects such as matte. In some applications it may be useful to apply a basecoat or a topcoat outside the metallizer 695. For example, certain industries, such as the cosmetics industry, commonly utilize both basecoats and topcoats applied outside the metallizer 695.

In one embodiment of the system of the present invention, a basecoat station and a topcoat station are integrated as additional modules on the same asynchronous conveyor system. The basecoat and topcoat stations comprise spray booths, solvent flash-off zones, UV cure ovens, and other peripheral equipment. While the basecoat station and topcoat station are both preferably connected with the metallizer via the conveyor, in some implementations, parts may be stored after molding and the conveyor may be disconnected from the molding machine. Further, in some implementations, the basecoat station, topcoat station, or both stations may be separated from the conveyor entirely.

The metallizing station contains all of the components necessary to load and unload parts from the stack prior to and immediately following the metallizing process. The options for transferring spindles to the stack depend highly on the chosen arrangement of the stack. Where a fixed stack is utilized, as in the configuration depicted in FIG. 16, a stack transfer robot 775 transfers parts between the load point 701 and the fixed stack 714. Where the stack utilizes plates assembled into a separable stack, a stack transfer robot 775 may transfer parts 710 between the load point 701 and the stack in a manner similar to the process for the fixed stack, or automated handling equipment may transport individual plates between the stack and the load point 701, where each plate is loaded and then transported back to the stack.

Figure 16:
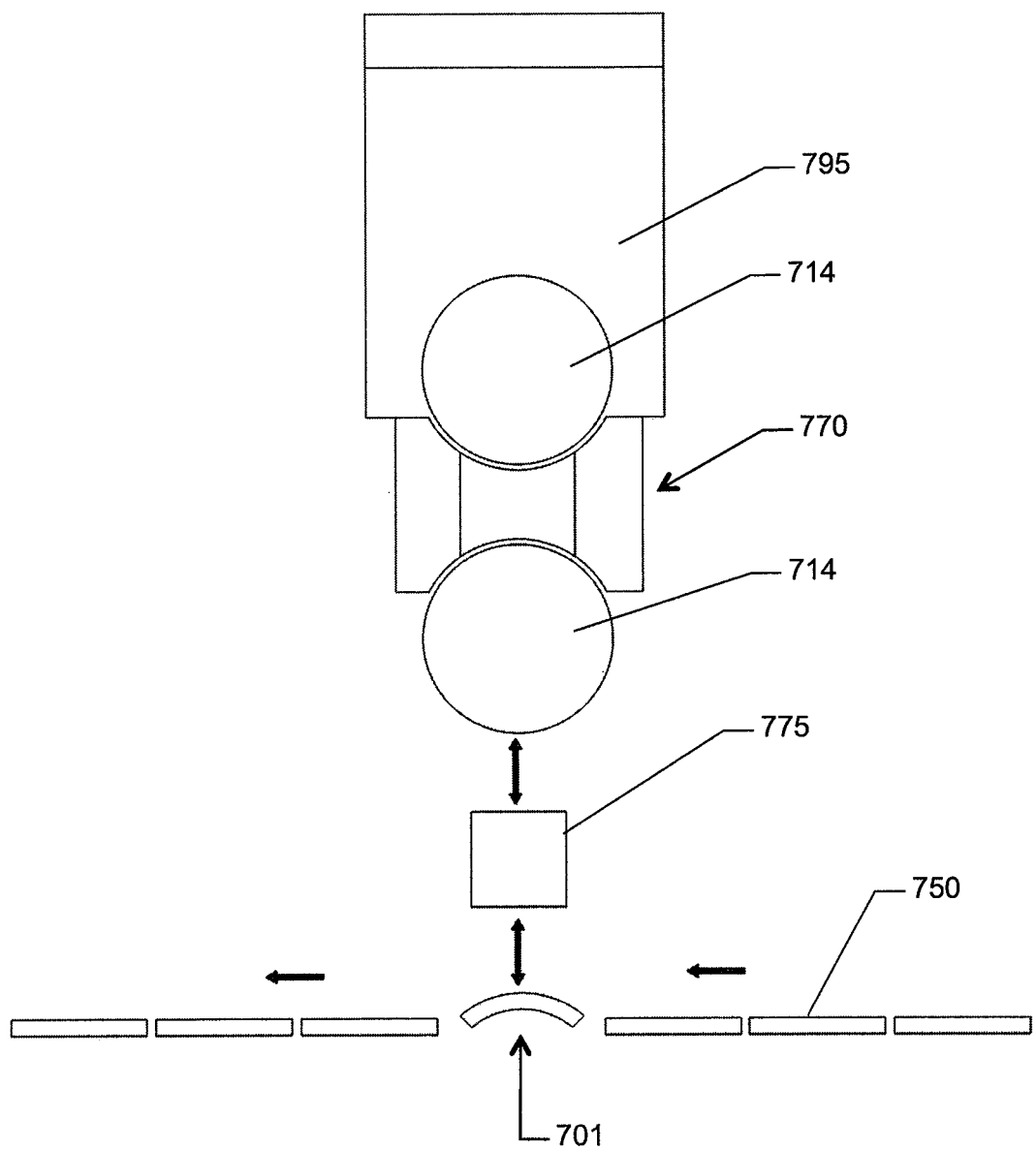
FIG. 16 shows a plan view of a metallizing station of the present invention.

As depicted in FIG. 16, loading a fixed stack 714 according to the present invention utilizes at least one transfer robot 775. The stack transfer robot 775 is positioned between the load point 701 in the conveyor 750 and the fixed stack 714. The load point 701 arranges conveyor pucks 622, which have parts 610 on spindles 624, for loading. The stack transfer robot 775 possesses a plurality of pick and place fingers as are known in the art. Preferably, these pick and place fingers are positioned in pairs, creating a set of upper pick and place fingers and lower pick and place fingers, whereby one set of pick and place fingers handles metallized parts 610 and the other set handles unmetallized parts 610 during the loading process. Preferably, the load point 701 mirrors the shape of the stack 714, permitting the stack transfer robot 775 to load 180 degrees of parts 610 per transfer cycle. Although the term loading is used, the stack transfer robot 775 is responsible for both loading and unloading. Preferably, the loading and unloading process occur simultaneously, but may occur in series.

The process of loading a fixed stack 714 that utilizes pins to hold spindles 620 can be fully automated to reduce part 610 handling and maximize system efficiency. Starting from the condition where a fixed stack 714 of metallized parts 610 has just been removed from the metallizer 795, the load point 701 contains conveyor pucks 622 loaded with unmetallized parts 610, and the stack transfer robot 775 is facing the load point 701 with the upper pick and place fingers empty and the lower pick and place fingers empty and aligned with the spindles 620 attached to the conveyor puck 622. The stack transfer robot 775 extends the lower set of pick and place fingers and grasps the spindles 620 attached to the conveyor pucks 622 in the load point 701. The stack transfer robot 775 then raises slightly, removing the spindles 620 from the conveyor pucks 622, and retracts the lower pick and place fingers. The stack transfer robot 775 then rotates so that it is facing the fixed stack 714 and raises or lowers to align its upper pick and place fingers with a row of metallized parts 610. The stack transfer robot 775 then extends its upper pick and place fingers, grasps the spindles 620 holding the metallized parts 610, raises slightly to remove the spindles 620 from the pins, and then retracts the upper set of pick and place fingers. The stack transfer robot 775 then raises slightly such that the lower pick and place fingers are aligned just above the fixed stack 714 row that was just unloaded. The stack transfer robot 775 then extends its lower pick and place fingers, lowers slightly, placing the spindles 620 holding unmetallized parts 610 on the fixed stack 714 pins, and retracts the lower pick and place fingers while releasing the spindles 620. The stack transfer robot 775 then rotates to face the load point 701 and raises or lowers such that it's upper pick and place fingers are positioned just above the empty conveyor pucks 622. The stack transfer robot 775 then extends its upper pick and place fingers, lowers slightly, placing the spindles 620 holding metallized parts 610 on the conveyor pucks 722, and retracts the upper pick and place fingers while releasing the spindles 620. Once the upper pick and place fingers are retracted, a full load cycle is complete, the conveyor pucks 622 are shuttled out of the load point 701, new conveyor pucks 622 containing unmetallized parts 610 enter the load point 701, and the cycle starts again.

Figure 17:
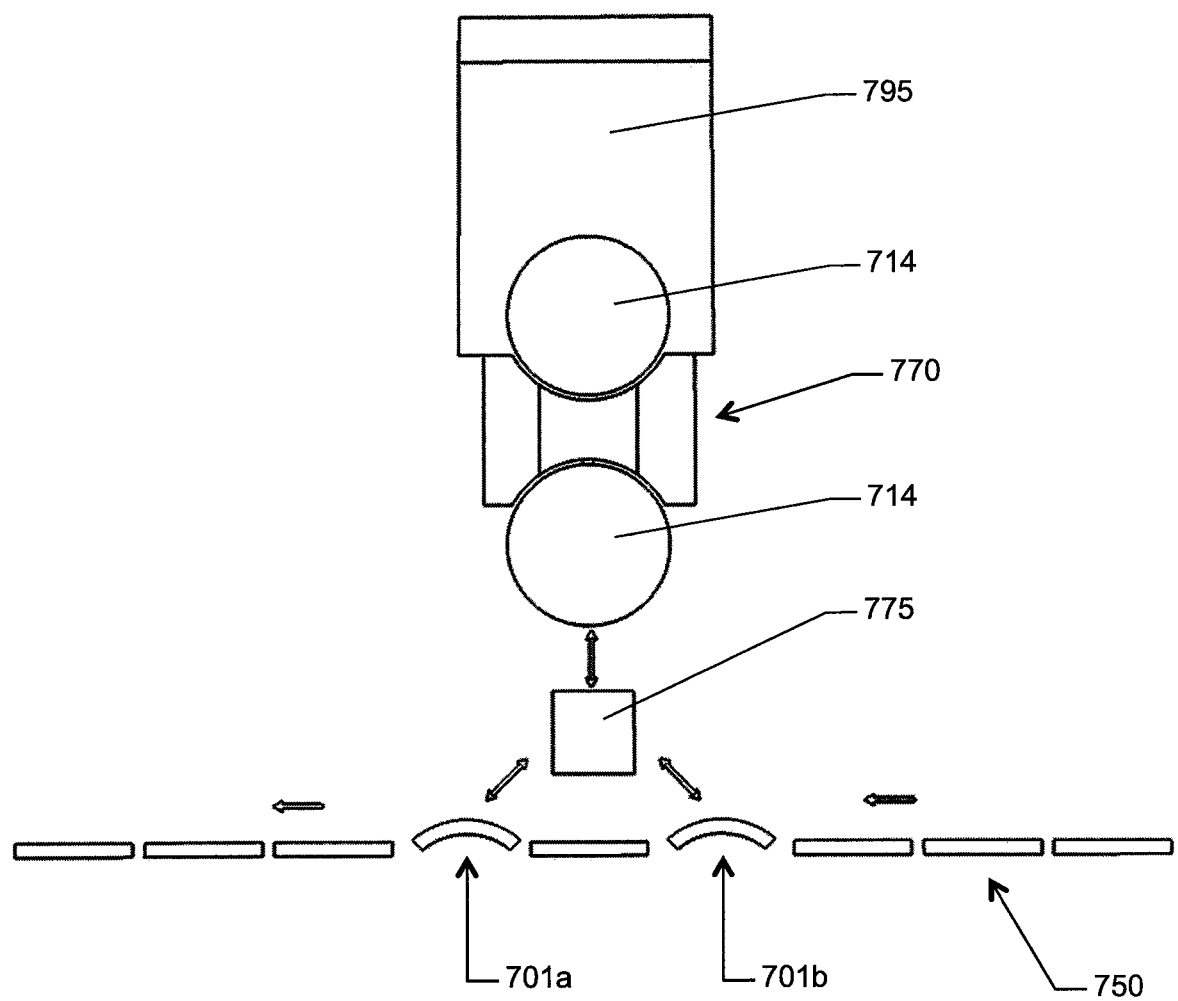
FIG. 17 shows a plan view of a metallizing station of the present invention.

Alternatively, as depicted in FIG. 17, two load points 701a and 701b may be utilized to facilitate the loading and unloading process. In the dual loading point configuration, conveyor pucks 622 with unmetallized parts 610 are arranged in the first load point 701a. Once the unmetallized parts 610 are removed from the conveyor pucks 622 as described above, the empty conveyor pucks 622 shuttle to the second load point 701b and are replaced in the first load point 701a with new conveyor pucks 622 holding additional unmetallized parts 610. With regard to the operation of the stack transfer robot 775, the stack transfer robot 775 picks the unmetallized parts 610 from the loading point 701a using the lower pick and place fingers as described above. The stack transfer robot 775 then rotates, picks the metallized parts 610 from the fixed stack 714 using the upper pick and place fingers, and places the unmetallized parts 610 held in the lower pick and place fingers in the same manner described above. The stack transfer robot 775 then rotates to face the second load point 701b, which contains empty conveyor pucks 622. The stack transfer robot 775 places the metallized parts 610 on the empty conveyor puck 622 pins 624 and then retracts the upper pick and place fingers while releasing the spindles 620. The conveyor pucks 622, which are now holding metallized parts 610 are shuttled out of the second load point 701b, while the stack transfer robot 775 rotates to face the first load point 701a and starts a new cycle of the loading process by picking unmetallized parts 610 from the conveyor pucks 622 located in the first load point 701a.

The loading process is repeated as many times as necessary until the entire stack is loaded. However, since the stack transfer robot 775 is unable to load the entire circumference of the fixed stack 714 in one cycle, the fixed stack 714 must be rotated in order to complete the loading process. This fixed stack 714 rotation may occur at the end of the cycle described above, which would result in each row of the fixed stack 714 being loaded before the stack transfer robot 775 moves to load the next row, or the stack transfer robot 775 may repeat the cycle above for each of the rows in the fixed stack 714 prior to the fixed stack 714 rotation, effectively loading the entire height of a portion of the circumference of the fixed stack 714 prior to rotation. In either configuration, the fixed stack 714 rotation corresponds to the number of spindles 620 that the stack transfer robot 775 is capable of handling per cycle. Preferably, the stack transfer robot 775 is capable of loading and unloading 180 degrees of the fixed stack 714 and the fixed stack 714 is rotated a corresponding 180 degrees to facilitate loading and unloading the full circumference of the fixed stack 714.

Although this example recites the upper pick and place fingers handling metallized parts 610 and the lower pick and place fingers handling unmetallized parts 610, a person of skill in the art will appreciate that these assignments could easily be reversed and the stack transfer robot 775 movement adjusted accordingly. In addition, where the fixed stack 714 utilizes clips 160 as depicted in FIG. 6, the movement of the stack transfer robot would be modified such that spindles 120 are removed from the clips 160 and inserted into the clips through extension and retraction of the stack transfer robot 775 instead of through the vertical motion described above.

Figure 18:
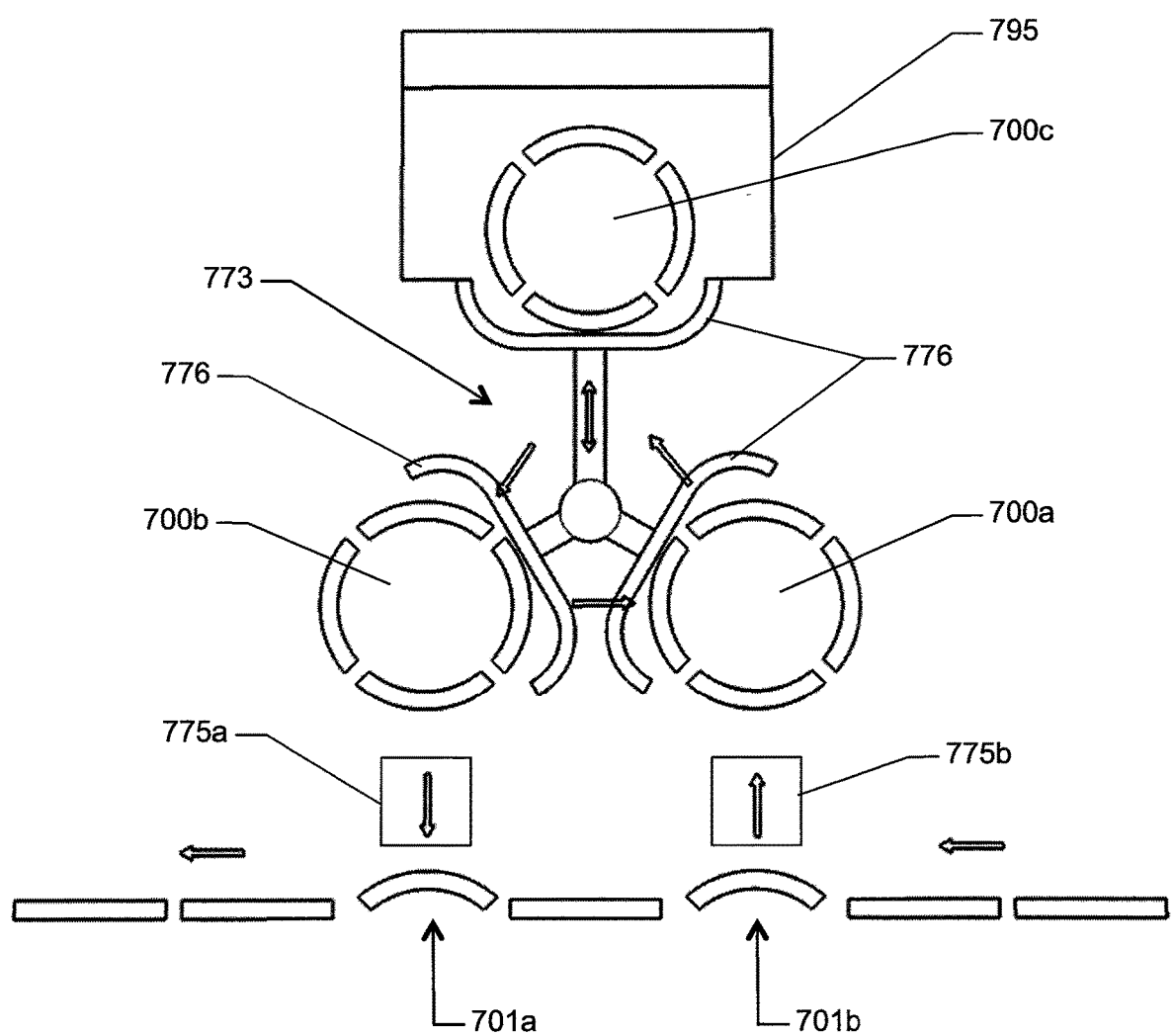
FIG. 18 shows a plan view of one form of single point loader utilizing three stacks.

In implementations where additional speed is required, it is possible to utilize a single point loader 773 similar to the one depicted in FIG. 18. In this configuration, the single point loader 773 comprises three metallizer load doors 776 and three stacks 700 (*a-c*). Adding an additional stack 700 permits the separation of the loading process such that one stack transfer robot 775*a* is dedicated to moving unmetallized parts from conveyor pucks 622 located in the unmetallized part load point 701*a* to the stack 700*a*, while a second stack transfer robot 775*b* is dedicated to removing metallized parts 610 from the stack 700*b* and placing them on conveyor pucks 622 located in the metallized part load point 701*b*. In this configuration, the stack transfer robots 775*a* and 775*b* would preferably possess only one set of pick and place fingers since each robot is dedicated to handling only metallized or unmetallized parts 610.

In one embodiment of the method for loading the stacks 700 using the single point loader 773 depicted in FIG. 18, a first stack transfer robot 775*a* loads unmetallized parts 610 onto a stack 700*a* by extending the pick and place fingers and grasping the spindle 620 attached to the conveyor puck 622. The stack transfer robot 775*a* then moves vertically to remove the spindles 620 from the conveyor pucks 622, retracts the pick and place fingers, and rotates to face the stack 700*a*. After aligning the pick and place fingers with an empty row of pins, the stack transfer robot 775*a* extends the pick and place fingers, lowers the spindles 620 onto the pins, and retracts the pick and place fingers while releasing the spindles 620. The stack transfer robot 775*a* then rotates to face the unmetallized part load point 701*a* to obtain the next set of unmetallized parts 610. This series of steps is repeated, with the necessary rotation of the stack 700*a*, until the entire stack 700*a* is loaded with unmetallized parts 610.

While the first stack transfer robot 775*a* is loading unmetallized parts 610 to the stack 700*a*, a second stack transfer robot 775*b* loads metallized parts 610 from a second stack 700*b*. To unload the stack 700*b*, the stack transfer robot 775*b* rotates toward the stack 700*b*, and aligns with a row of metallized parts 610. The stack transfer robot 775*b* then extends its pick and place fingers, grasps the spindle 620, and moves upward, removing the spindle 620 from the pin. The stack transfer robot 775*b* then rotates to face the metallized part load point 701*b*, lowers the spindles 620 onto the conveyor pucks 622, and retracts the pick and place fingers while releasing the spindles 620. This series of steps is repeated, with the necessary rotation of the stack 700*b*, until the entire stack 700*b* of metallized parts 610 is empty.

Once the stack 700*b* of metallized parts is completely unloaded, the empty stack 700*a* is completely loaded with unmetallized parts, and the stack 700*c* in the metallizer completes processing, the single point loader 773 is rotated such that the full stack 700*a* of unmetallized parts is placed in the metallizer 795, the empty stack 700*b* is moved to the unmetallized part loading point 701*a*, and the stack 700*c* of newly metallized parts is moved to the metallized part load point 701*b*.

Figure 19:
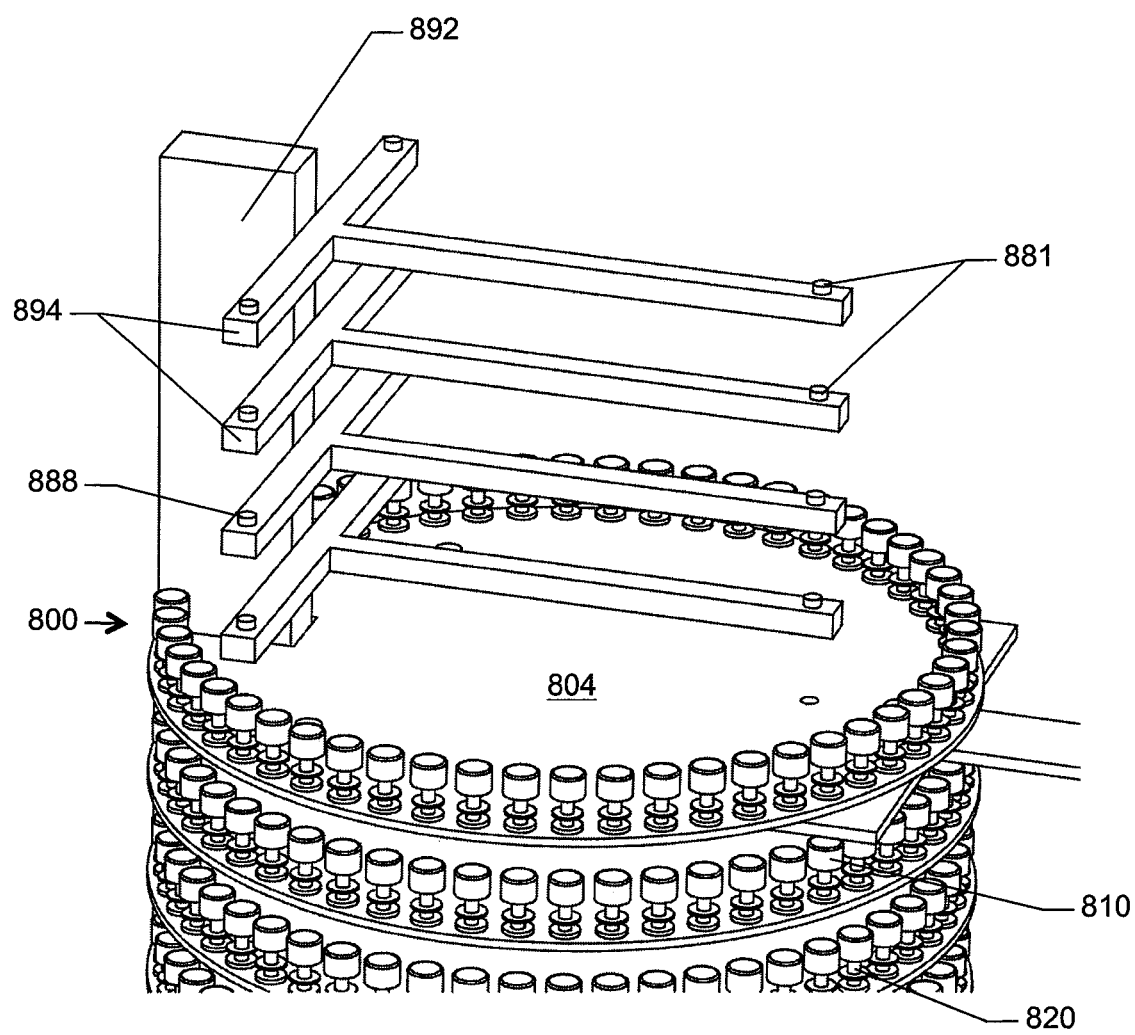
FIG. 19 shows a perspective view of a separable stack

Turning to FIG. 19, plates 804 may be configured into a separable stack 800 that utilizes a stack backbone 892 and plate mounting arms 894. Reliable plate 804 engagement with the automated handling equipment and proper part 810 rotation in the metallizer depend upon accurate and repeatable plate 804 location. One method for ensuring accurate and reliable plate 804 location utilizes datum pins 881. Datum pins 881 may be located on the plate mounting arms 894, for engagement with corresponding plate datum holes 894, located in the plate 804. Active locking features may be implemented on the datum pins 881 to lock the plate 804 into position such that it cannot be removed until an unlock feature is enabled. Alternate locking methods known to one of skill in the art, such as a locking method utilizing features in the backbone to form a bayonet style lock, may be employed.

Figure 20:
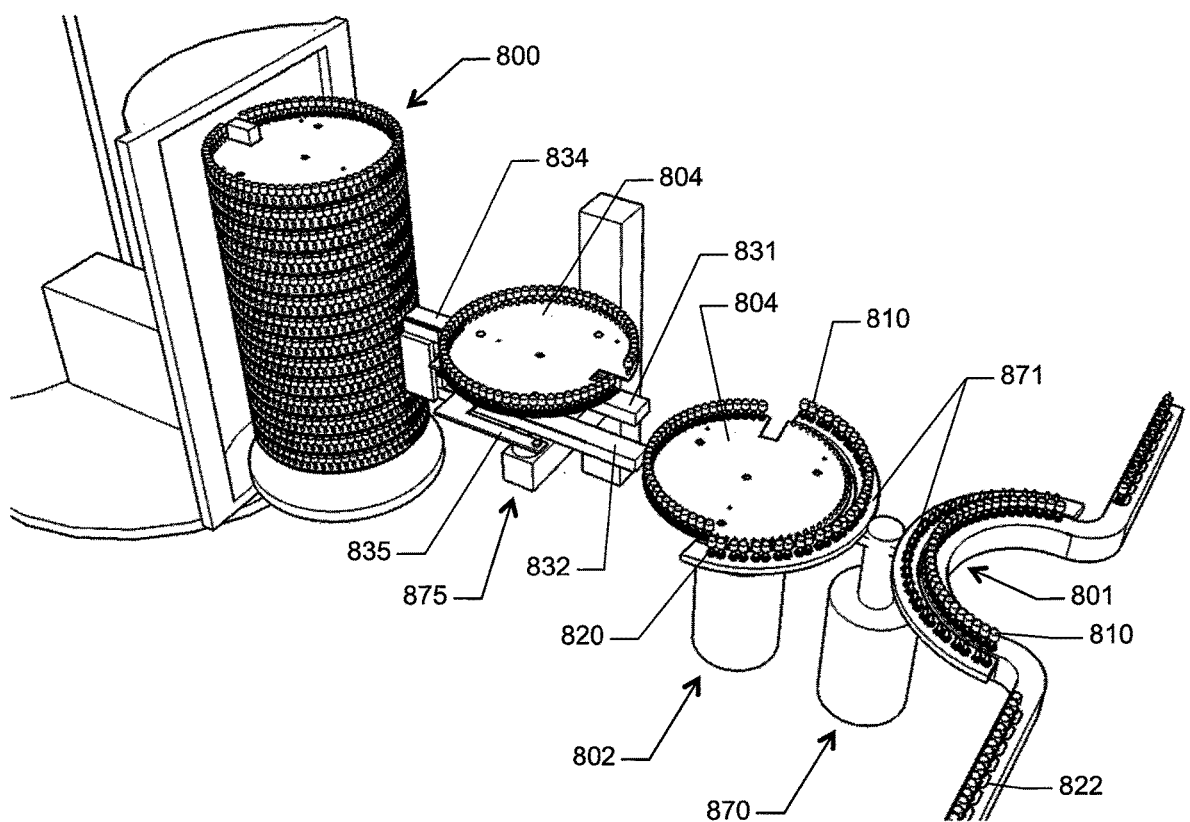
FIG. 20 shows a perspective view of one embodiment of a metallizing station of the present invention.

Turning now to FIG. 20, a separable stack 800 may be loaded using a process identical to the process described for loading a fixed stack, but a separable stack 800 also permits the removal of plates 804 from the stack 800 for direct loading at the load point 801. FIG. 20 depicts a loading setup for a separable stack 800, where the plates are removed from the separable stack 800 for loading and a plate transport robot 875 is used to transfer the plates 804 between the separable stack 800 and the plate staging point 802. In addition, a pick and place robot 870 is utilized to transfer the spindles 820 between the plate 804 and the conveyor pucks 822, which are located at the load point 801. Preferably, the plate transport robot 875 has an upper actuator 831 and a lower actuator 832, with the upper actuator 831 attached to an upper end effector 834 and a lower actuator 832 attached to a lower end effector 835. The upper actuator 831 and lower actuator 832 extend and retract the upper end effector 834 and lower end effector 835, and the entire plate transfer robot 875 is capable of vertical and rotational motion.

While the retrieval and placement of plates 804 can be done without feedback of proper operation, it is reasonable to install feedback means to interlock the various robot handling steps. Further, it is also possible to implement physical locking schemes on the plate mounting arms 894, the lower end effector 834, and the upper end effector 835. One way to achieve a locking scheme is to monitor the handoff process through the use of an optical sensor to validate proper plate 804 position. Alternatively, proximity sensors could be mounted to the lower end effector 834, the upper end effector 835, or both to monitor plate 804 position. A successful handoff is verified by monitoring sensor states throughout the handoff move. A handoff would sequence through the sensor on and off states in a pre-determined pattern, with a final state indicating a successful handoff.

Plate 804 handling will work reliably if plates 804 are properly placed at their mounting positions. It is reasonable, therefore, to implement locking means at the stack backbone 892, the plate mounting arms 894, the upper end effector 834 or the lower end effector 835 to immobilize a plate as required. Where additional security is required, locking mechanisms may be employed at multiple locations. In addition, the mounting arm datum pins 881 can be made in a manner where the datum pins 881 can be actuated to lock the plate 804 into position. This locking action can be achieved with a bayonet type scheme or a two-part expanding datum pin may be used. The locking or unlocking of plates 804 on the plate mounting arms 894 can be done using mechanical, electrical or pneumatic actuation and is left as part of the design implementation. The plate 804 would be unlocked once the upper end effector 834 or lower end effector 835 is in position to pick a plate 804. It would re-lock once the plate 804 has been placed in position and validated to be at its proper location. In addition, the end effector datum pins 888, if used, can also be locked or unlocked in a manner similar to the mounting arm datum pins 881. The end effector datum pins 888 would lock upon an up move into the plate datum holes. The end effector datum pins 888 would remain locked until a plate 804 has been placed on the plate mounting arm 894 at the separable 800 stack or at the plate staging point 802.

During the separable stack 800 loading process, the plate transfer robot 875 transfers plates 804 to the plate staging point 802, where the pick and place robot 870 then loads the spindles 820. A full cycle of the plate transport robot 875 begins when a plate 804 of unmetallized parts 810 is attached to lower end effector 835, the plate transfer robot 875 is facing the load point 801 and both the upper end effector 834 and the lower end effector 835 are retracted. The plate transfer robot 875 then rotates to face the separable stack 800, and raises or lowers so that the upper end effector 834 is aligned with a plate 804 of metallized parts 810. The upper end effector 834 is then extended into the separable stack 800. If locking mechanism are used, the engagement of the upper end effector 834 with the plate as the upper end effector 834 enters the separable stack 800 may be used to unlock the plate 804 from the separable stack 800. Once the upper end effector 834 is extended, the plate transfer robot 875 moves vertically, engaging the end effector datum pins 888 with the plate datum holes. Once the end effector datum pins 888 are engaged, the plate transfer robot 875 continues to move vertically, lifting the plate 804 from the plate mounting arm 894, and then retracts, removing the plate 804 from the separable stack.

Once the plate 804 of metallized parts 810 is removed from the separable stack 800, the plate transfer robot 875 moves vertically to align the lower end effector 835 with the plate mounting arm 894 vacated by the prior sequence of steps. The lower end effector 835 is then extended into the separable stack 800 and the plate transfer robot 875 lowers the plate 804 of unmetallized parts 810 onto the plate mounting arm, thereby engaging the plate mounting arm datum pins 881 with the plate datum holes. Once engagement is confirmed, the plate transfer robot 875 moves lower, releasing the plate 804, then retracts the lower end effector and rotates such that the plate transfer robot 875 is facing the plate staging point 802.

Once the plate transfer robot 875 is facing the plate staging point 802, the robot aligns the lower end effector 835 with the plate 804 of unmetallized parts 810 located in the plate staging point 802. The lower end effector 835 is then extended to engage the plate 804 of unmetallized parts 810 and, once the datum pins are secured, moves vertically to remove the plate 804 of unmetallized parts 810 and retracts the lower end effector 835. The plate transfer robot 875 then aligns the upper end effector 834 with the plate staging point 802, extends the upper end effector 834, and lowers the plate 804 of metallized parts 810 into the plate staging point 802. Once the plate 804 of metallized parts 810 is secured at the plate staging point 802, the plate transfer robot 875 retracts the upper end effector 834, returning the plate transfer robot 875 to the starting position.

A person of skill in the art will appreciate that there may be implementations where it is advantageous to begin or end the separable stack loading process with less than a complete cycle of the plate transfer robot 875. In addition, the specific references to the upper end effector 834 and lower end effector 835 are for example only and these roles may be swapped with a corresponding adjustment to the movements of the plate transfer robot 875.

While the plate transfer robot 875 is moving plates 804 between the separable stack 800 and the plate staging point 802, the pick and place robot 870 transfers spindles 820 between the conveyor pucks 822 and the plates 804. As depicted in FIG. 20, the pick and place robot 870 may have two arms 871 each possessing a plurality of pick and place fingers. Preferably, the arms 871 are shaped in an arc that approximates the circumference of the plates 804. The arms 871 are arranged such that one arm 871 faces the plate staging point 802 and one arm faces the load point 801. One step of the pick and place robot 870 cycle begins when the plate 804 of metallized parts 810 is placed in the plate staging point 802, the plate 804 in the plate staging point 802 has been rotated to a predetermined starting position, and the load point 801 is full of conveyor pucks 822 holding unmetallized parts 810. Once activated, the pick and place robot 870 extends the pick and place fingers attached to the arm 871 facing the load point 801 and the pick and place fingers grasp the spindles 820 located on the conveyor pucks 822. Simultaneously, the pick and place robot 870 extends the pick and place fingers attached to the arm facing the plate staging point 802 and the pick and place fingers grasp the spindles 820 located on the plate 804. The pick and place robot 870 then moves vertically, simultaneously removing the spindles 820 from the pins on both the conveyor pucks 822 and the plate 804. Once the spindles 820 clear the pins, the pick and place robot 870 rotates such that the arms 871 are reversed and the spindles 820 holding metallized parts 810 are now facing the conveyor pucks 822 and the spindles 820 holding unmetallized parts 810 are now facing the plate 804. The pick and place robot 870 then lowers the spindles 820 onto the conveyor pucks 822 and simultaneously lowers the spindles 820 onto the plate 804. Once the spindles 820 are secured to the conveyor pucks 822 and the plate 804, the pick and place fingers retract and release the spindles 820. The conveyor pucks 822 are then shuttled out of the load point 801 and replaced by conveyor pucks 822 holding unmetallized parts 810, and the plate staging point 802 is rotated such that spindles 820 holding metallized parts 810 are facing the pick and place robot 870 arm 871.

The configuration of the pick and place robot 870 arm 871 determines the number of steps required to load a full plate 804. Preferably, the arm 871 is adapted to handle one half of the total number of spindles 820 held on a plate 804, thereby limiting the loading cycle to two steps. However, additional steps may be utilized depending on the requirements of the actual implementation. For example, if 120 degrees of parts are loaded, three steps are required. Once the plate 804 is fully loaded, the plate staging area 802 is rotated to its original starting position in preparation for engagement with the plate transfer robot 875.

While the movements described pertain to embodiments where the spindles 820 are attached to the conveyor pucks 822 and the plate 804 via pins, where the spindles 820 are secured using clips 160 as depicted in FIG. 6, the movement of the pick and place robot 870 would be modified such that spindles 120 are removed from the clips 160 and inserted into the clips 160 through extension and retraction of the pick and place fingers instead of through the vertical motion described above.

Figure 21:
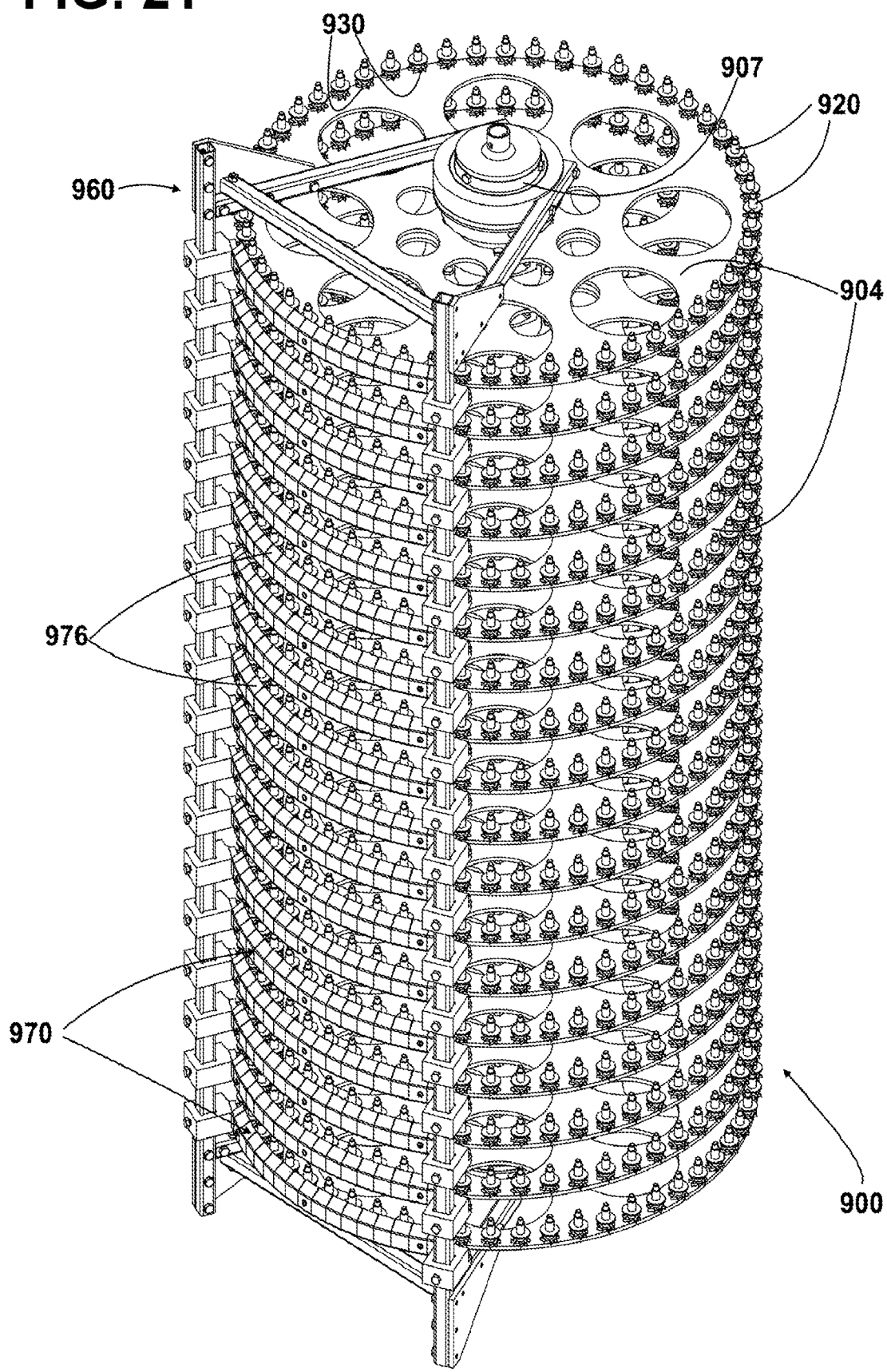
FIG. 21 shows a perspective view of one embodiment of the integrated stack of the present invention.

FIG. 21 depicts a further embodiment, wherein the rotation system is attached to the stack to create an integrated stack 900. The integrated stack 900 has several advantages over the fixed and separable stacks discussed above. Notably, the integrated stack 900 facilitates loading and unloading the metallizer because the integrated stack 900 alleviates the need to accurately position the stack in relation to the rotation unit. In addition, because the static rotation unit 470 described above is installed within the metallizer, it is cumbersome to reconfigure the static rotation unit 470 if the user desires to alter the part density of the stack. For some product types, a single integrated stack 900 is adequate. However, utilizing more than one integrated stack increases system throughput by permitting loading and unloading of one integrated stack to occur while a separate integrated stack is being processed inside the metallizer. In addition, because the integrated stack 900 includes the rotation unit, a user can configure multiple integrated stacks 900 with the desired part densities and simply process the appropriate integrated stack 900 without making any changes to the metallizer. This setup increases the flexibility of the system and reduces the cost of processing parts of varying sizes.

The integrated stack 900 is depicted in FIG. 21 as having a center rod 907, which secures a plurality of plates 904. The plates 904 are depicted with pins, with spindles 920 atop and concealing the pins. While the drive ring 930 is depicted as located on the pin, the drive ring could also be located on the spindle 920. The integrated stack 900 also has a support frame 960, and a plurality of rotation drive systems 970. The support frame is attached to the center rod 907 in a manner that allows rotation of the support frame 960 about center axis of the integrated stack 900. The plates 904 may be adjustably secured to the center rod 907 using collars or other mechanical fasteners as known in the art. Alternatively, the plates 904 may be fixedly secured to the center rod 907 by welding or other known attachment process.

Figure 22A:
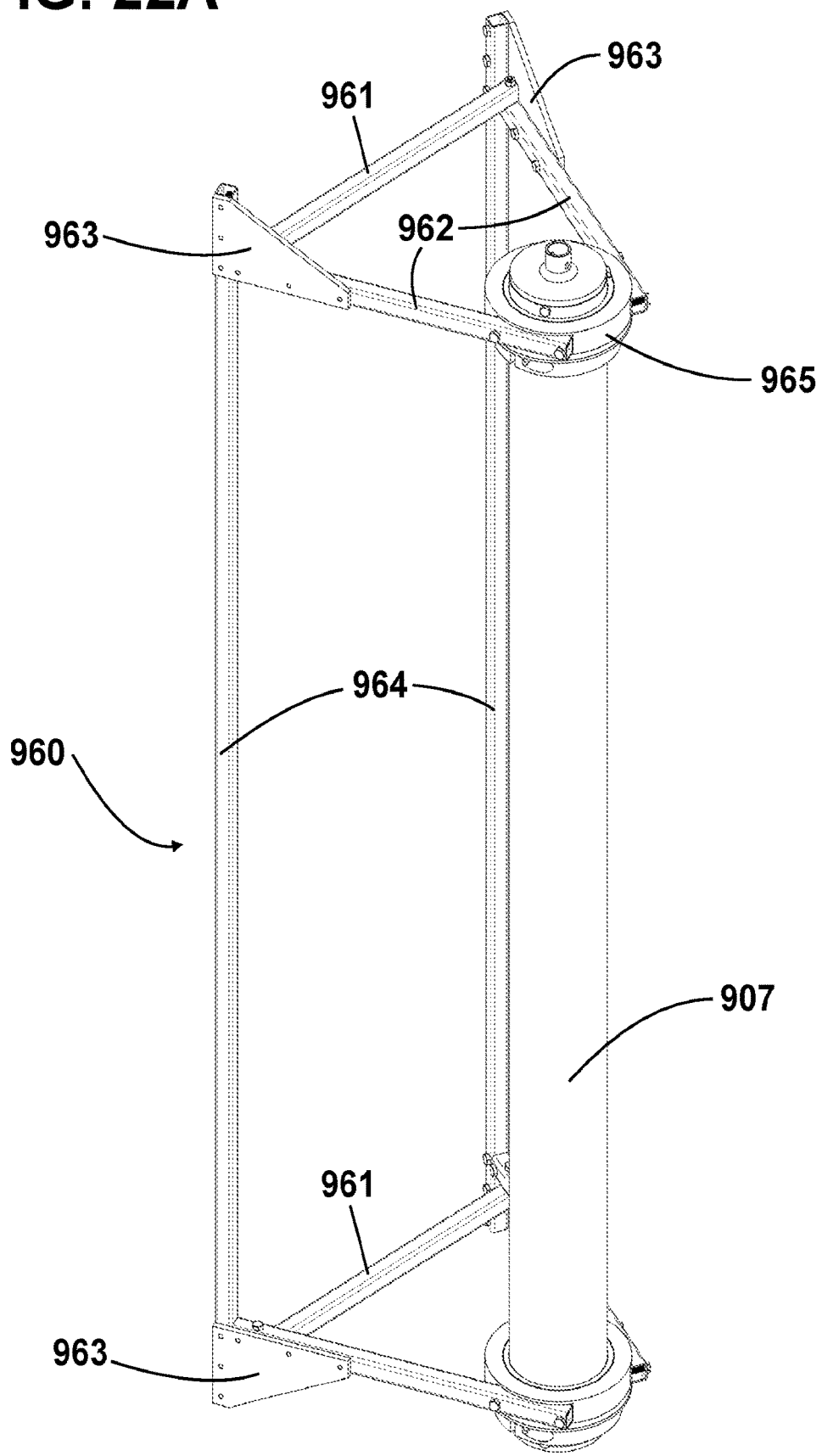
FIG. 22A shows a perspective view of the center rod and the support frame of one embodiment of the integrated stack of the present invention.

Turning to FIG. 22A, the center rod 907 and support frame 960 are depicted. The support frame utilizes horizontal connecting arms 962, which connect to the vertical support members 964 and one or more frame collars 965. The support frame is also depicted as having cross members 961 and gussets 963. However, a person of skill in the art will appreciate that the support frame 960 can be any configuration that provides a rigid frame capable of supporting the rotation drive systems 970.

Figure 22B:
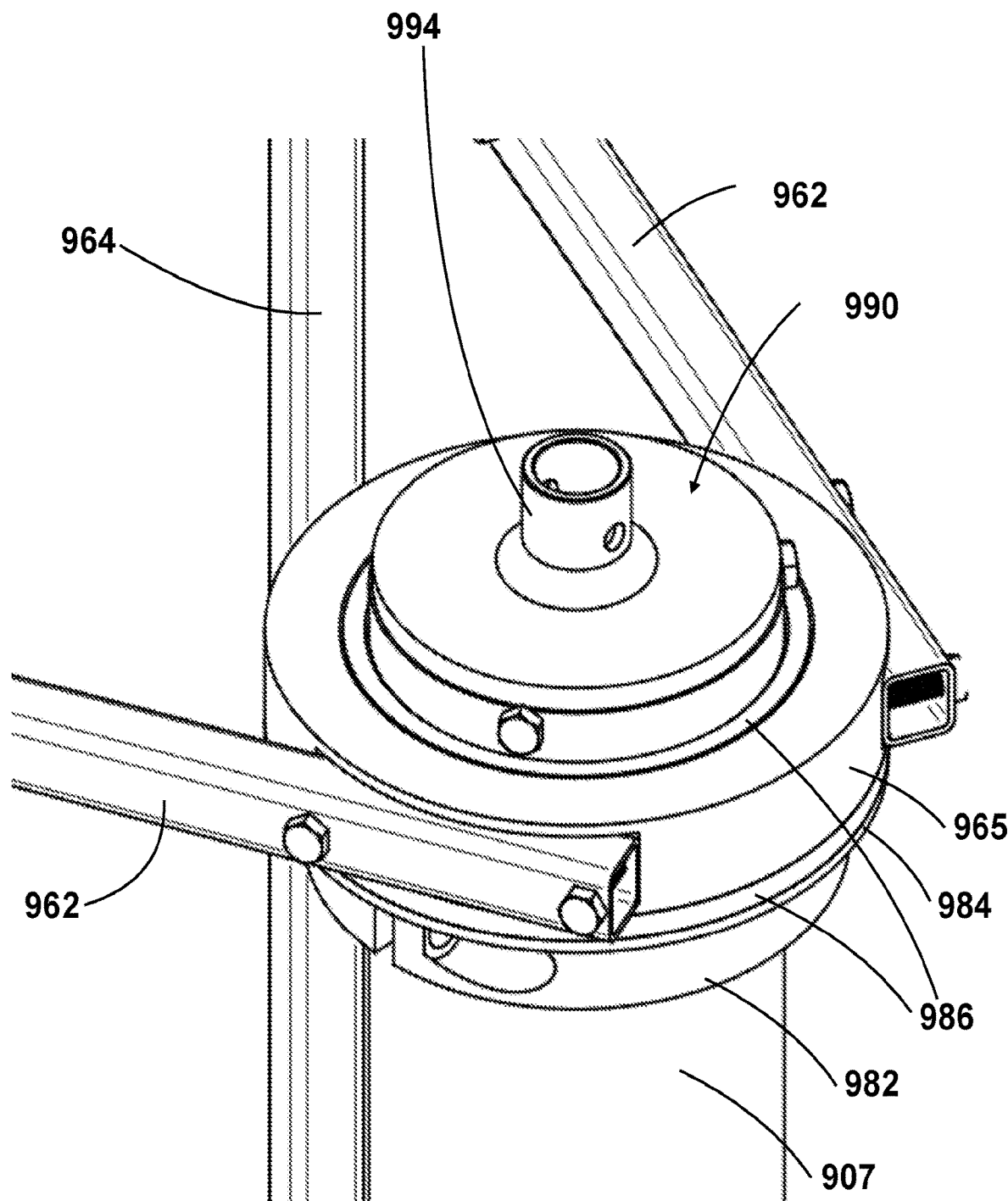
FIG. 22B shows a detail perspective view of the top section of the center rod and the support frame of one embodiment of the integrated stack of the present invention.

FIG. 22B depicts the top portion of the integrated stack 900, including the connection of the support frame 960. A fastening collar 982 is secured to the center rod 907. The fastening collar 982 may be adjusted vertically to achieve the desired positioning of the support frame 960. A washer 984, or other bearing surface, lies on above the fastening collar 982 and supports a low-friction insert 986.

As depicted, the low-friction insert 986 is machined to provide a low-friction material between the frame collar 965 and the center rod 907 and also between the frame collar 965 and the washer 984. The low-friction insert 986 is a material such as high-density polyethylene, a polytetrafluoroethylene formula, or other low-friction material capable of enabling rotation of the frame collar 965 about the center rod 907 and surviving the environment within the metallizer. The low-friction insert 986 facilitates the rotation of the frame collar 965, but preferably provides sufficient residual friction that the support frame 960 will maintain its position relative to the integrated stack 900 as the integrated stack 900 is rotated.

Atop the center rod 907 is a hub 990. The hub 990 extends into the center rod 907 and includes a top surface 992, which covers the top opening in the center rod 907. The hub 990 is secured to the center rod 907 in any manner known in the art. In addition, the hub 990 includes a connection port 994. The connection port 994 is sized and shaped to mate with features in the metallizer to secure the integrated stack 900 and to enable rotation of the integrated stack 900.

While FIG. 22B depicts the top portion of the integrated stack 900, it should be understood that the bottom section is substantially similar in design, utilizing a fastening collar 982, a washer 984, a low-friction insert 986 a frame collar 965, and a hub 990. In addition, a gear, a sprocket, a belt, a cam, a motor or another similar feature as know to one of skill in the art may be included as part of the top or bottom portion of the integrated stack 900 to facilitate rotation of the integrated stack 900.

Figure 23A:
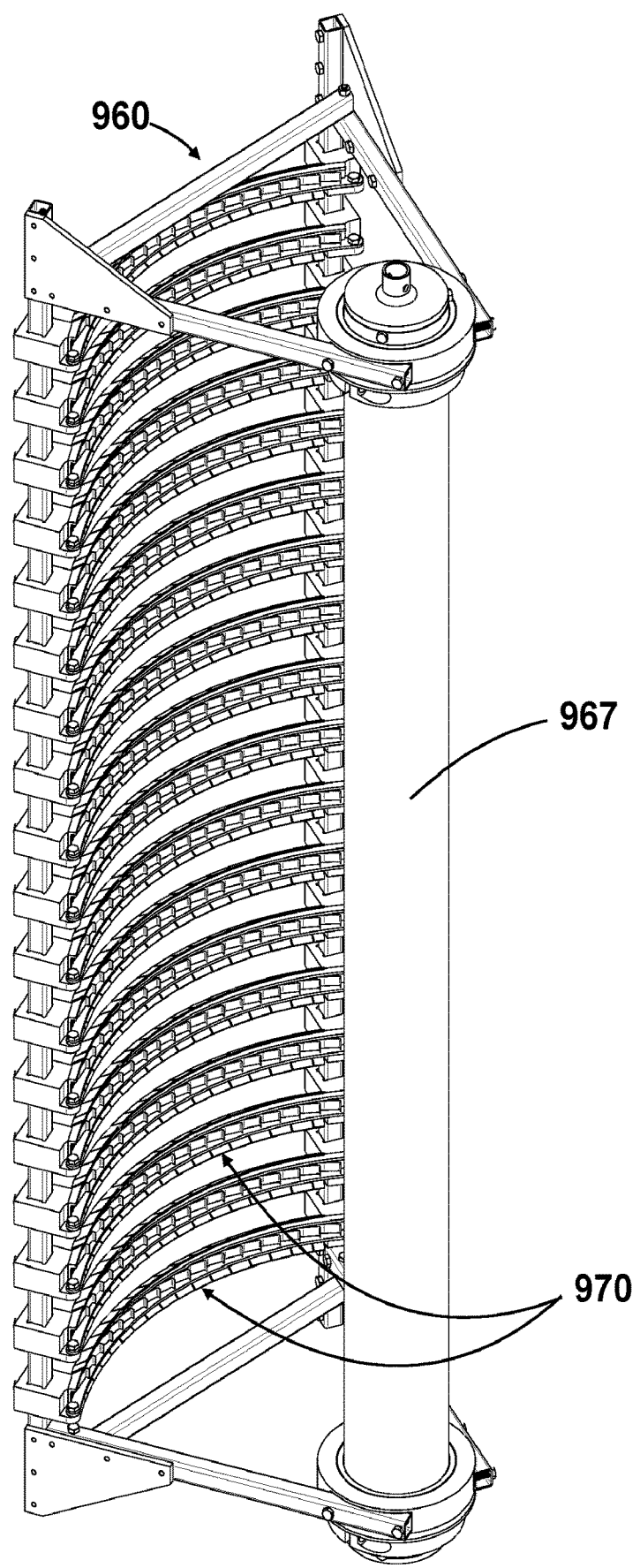
FIG. 23A shows a perspective view of the center rod, the support frame and a plurality of rotation drive systems of one embodiment of the integrated stack of the present invention.
Figure 23B:
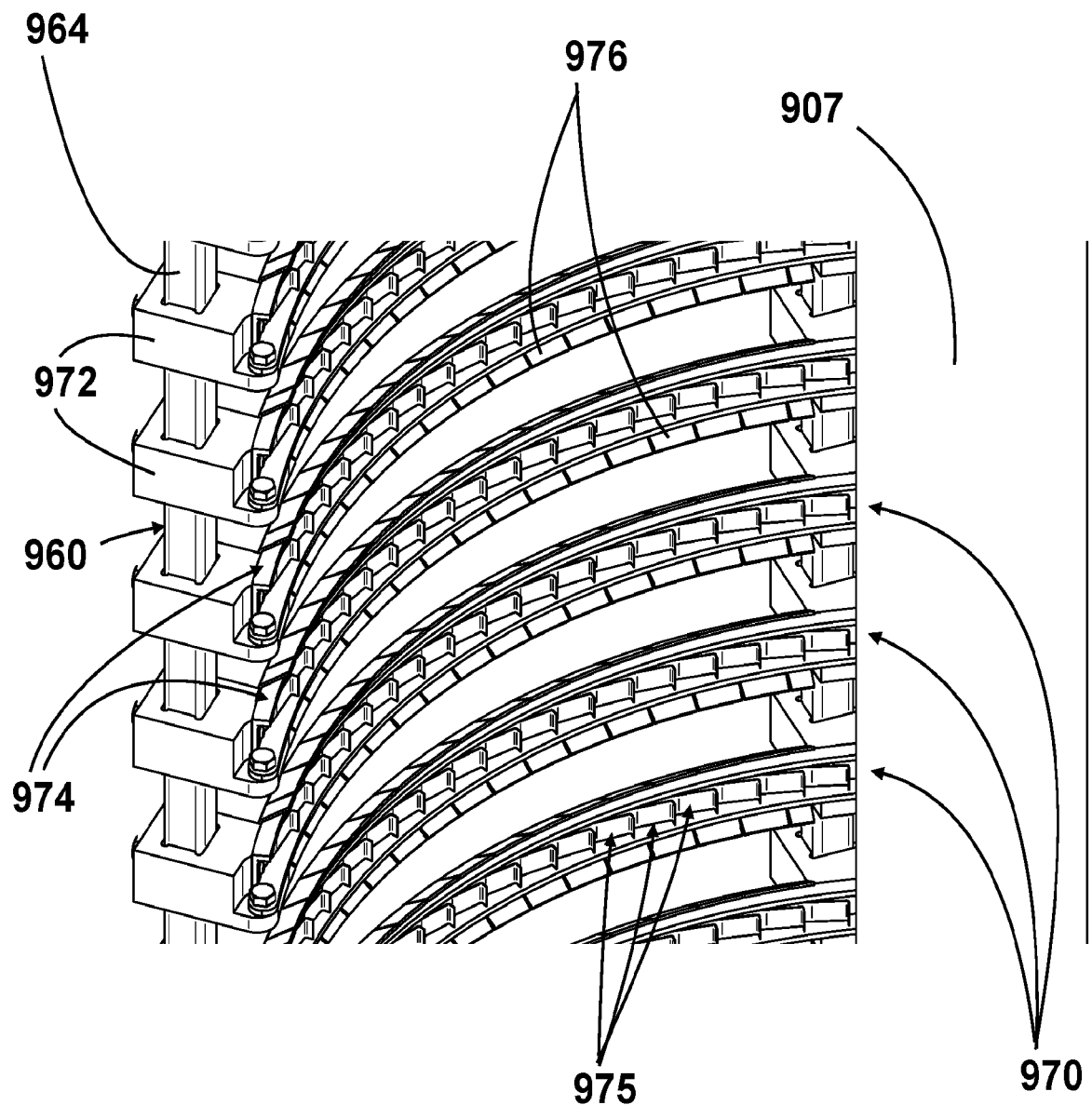
FIG. 23B shows a detail perspective view of the rotation drive systems of one embodiment of the integrated stack of the present invention.

Turning to FIG. 23A, a plurality of rotation drive systems 970 attached to the vertical support members 964 of the support frame 960. As shown in more detail in FIG. 23B, each rotation drive system 970 is attached to the support frame 960 via mounting blocks 972. The mounting blocks 972 can be adjusted vertically on the support frame 960 and may be secured to the support frame 960 via a mechanical fastener or other similar manner. The mounting blocks 972 secure each end of a mounting bracket 974. The mounting brackets 974 are curved to substantial mirror the curvature of the exterior edge of the plates 904 of the integrated stack 900.

Secured to each mounting bracket 974 are a plurality of compliant drive fingers 975. The compliant drive fingers 975 are arranged in an arc with a radius approximately the same as the outer radius of the integrated stack 900. The mounting bracket 974 can be configured to shield the compliant drive fingers 975 during the metallization process. However, optionally a shield 976 may be attached to the outer surface of the mounting bracket 974. Where a shield 976 is employed, it is advantageous to design the shield 976 to ensure maximum and uniform deposition during the metallization process. The shield 976 can be secured to the mounting bracket 974 via mechanical fasteners, allowing easy removal of the shield 976 for maintenance or replacement.

Figure 24:
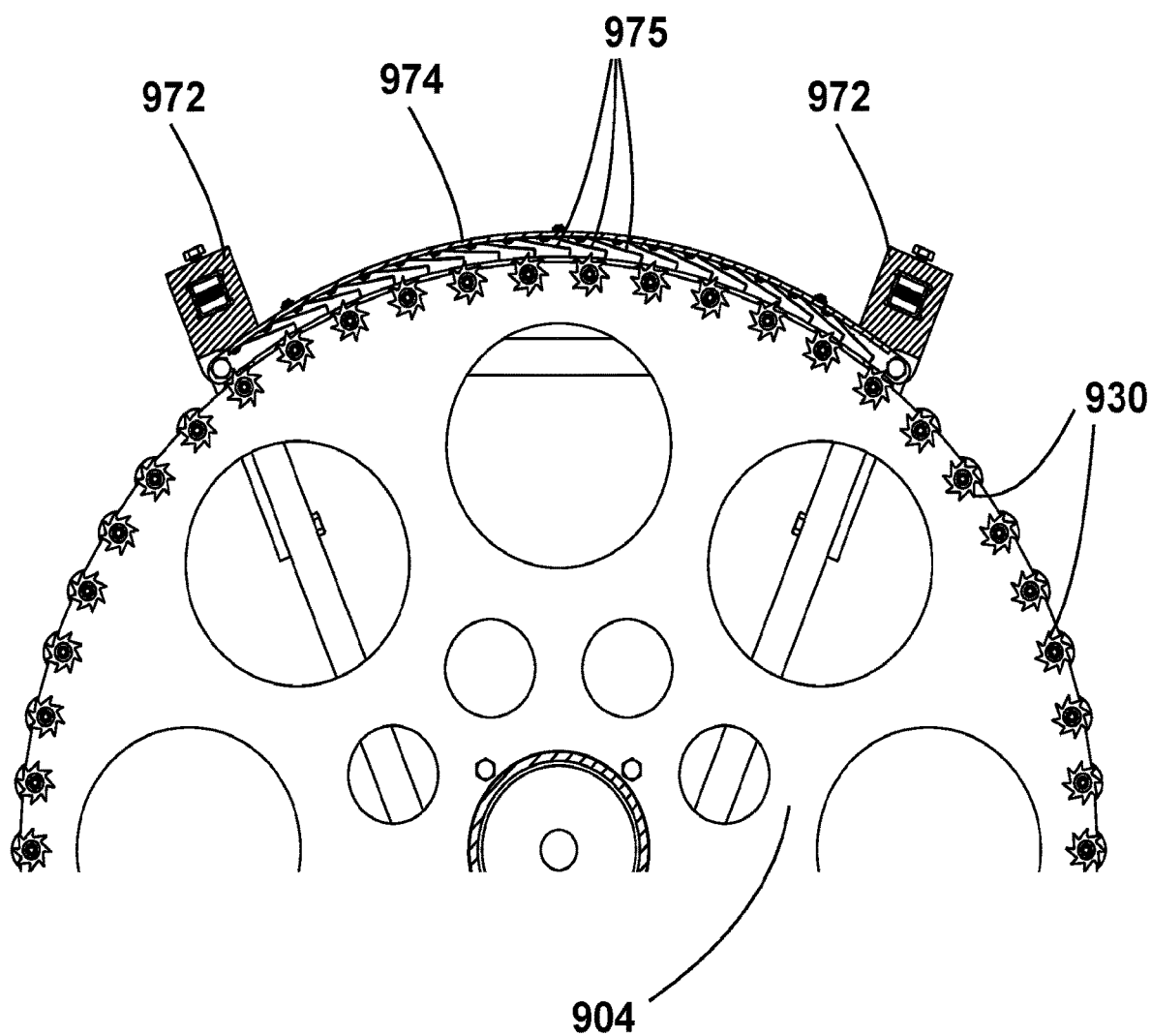
FIG. 24 shows a detail top view of the interaction between a plate and a rotation drive system of one embodiment of the integrated stack of the present invention.

Turning the FIG. 24 the interface between the drive rings 930 and the compliant drive fingers is shown. To ensure even coating, part rotation is required while the parts pass through the process zone of the metallizer. Therefore, the rotation drive systems 970 are positioned such that the compliant drive fingers 975 are arranged throughout the process zone, which is located in front of the coating source. While the compliant drive fingers 975 may extend beyond the process zone, part rotation out of the process zone causes needless frictional resistance to rotation of the entire integrated stack 900. Preferably, there is a sufficient number of compliant drive fingers 975 in front of the coating source to provide at least one full rotation of each part as the part passes through the process zone.

The support frame 960 of the integrated stack 900 rotates around the center axis of the integrated stack 900 in a manner that maintains contact between the compliant fingers 975 of the rotation drive system 970 and the drive rings 930. By enabling rotation, the support frame 960 can be rotated to facilitate loading and unloading of the integrated stack 900. In addition, rotation of the support frame 960 inside the metallizer facilitates optimal coating. The location of the support frame 960 can be easily indexed using physical stops that contact the support frame 960 at desired locations. As described above, the interface between the low-friction insert 968 and the frame collar 965 preferably possesses sufficient friction that the support frame will maintain its position relative to the integrated stack 900 as the integrated stack 900 is rotated. However, when the support frame 960 contacts a physical stop, the low-friction insert permits the stack to easily rotate while the support frame 960 remains stationary against the mechanical stop.

Physical stops can take any form known in the art for mechanical stops. Further, these mechanical stops can be actuated, creating the possibility for a range of stopping positions. During the metallizing process, a single mechanical stop may be used in the following manner. First, an integrated stack is loaded into the metallizer and secured in place, preferably via the connection ports 994, located on the hub 990. The integrated stack 900 is then rotated relative to the metallizer until the support frame 960 contacts a mechanical stop. The mechanical stop is located in the metallized such that once the support frame 960 contacts the mechanical stop the support frame 960 and the attached rotation drive systems 970 are located in the process zone. Continued rotation of the integrated stack 900 will rotate the plates 904, but the support frame 960 and the attached rotation drive systems 970 will remain stationary in the process zone. In this position, the proper rotation of the parts occurs as the plates and parts pass through the process zone.

In addition, where there are multiple processes and coatings applied in the metallizer, multiple stops can be employed. As known to a person of skill in the art, mechanical stops can be actuated in a manner that will allow the support frame 960 to stop at different locations within the metallizer. For example, a first mechanical stop can be actuated, such that rotation of the integrated stack 900 causes the support frame 960 to contact the mechanical stop in a position where the support frame 960 is located in a metallizing process zone. The integrated stack 900 is then rotated in order to metallize the parts. Once metallization is complete, the first mechanical stop can be retracted and a second mechanical stop can be actuated. When the support frame contacts the second mechanical stop, the support frame can be located in a second process zone where an overcoat or other secondary coating can be applied. Once again, continued rotation of the integrated stack 900 will leave the support frame 960 and the attached rotation drive systems 970 located in the process zone, ensuring proper rotation of the parts. In this manner multiple coatings can be applied in situ.

During the loading and unloading process, mechanical stops can also be used to position the support frame 960 and the attached rotation drive systems 970 so that loading and unloading robotics can access the stack. For example, once an integrated stack 900 is removed from the metallizer, the integrated stack 900 can be rotated until the support frame 960 contacts a mechanical stop that positions the support frame 960 on the opposite side of the integrated stack 900 from loading and unloading robotics. In this position, the robotics can unload one half of the stack and, if desired, load the stack with new parts. Once the first unloading and loading sequence is completed, the stack is rotated 180 degrees. However, because the support frame 960 is fixed in place by the mechanical stop, only the plates 904 will rotate and the support frame 960 and the attached rotation drive systems 970 will remain on the opposite side of the integrated stack 900 from loading and unloading robotics. By rotating the stack 180 degrees, the loading and unloading robotics can load or unload the remainder of the parts.

As described above in relation to the fixed and separable stacks and as shown in FIGS. 15 and 18, multiple integrated stacks 900 may be used simultaneously in order to increase system throughput. In addition, while the support frame 960 is depicted and described as being attached to the center rod 907, a person of skill in the art will appreciate that the support frame 960 can be attached to any of the stack configurations, both fixed and separable described herein without deviating from the spirit of the invention. Specifically, all that is required is to ensure that the support frame 960 is connected in a manner that ensures that the rotation drive systems 970 are positioned such that the compliant drive fingers 975 contact the drive ring located on either the pins or the spindles and ensures that the rotation drive systems 970 rotate about the center axis of the stack.

It is noted that the foregoing examples have been provided merely for the purpose of explanation and are in no way to be construed as limiting of the present invention. While the present invention has been described with reference to exemplary embodiments, it is understood that the words, which have been used herein, are words of description and illustration, rather than words of limitation. Although the present invention has been described herein with reference to particular means, materials and embodiments, the present invention is not intended to be limited to the particulars disclosed herein; rather, the present invention extends to all functionally equivalent structures, methods and uses.

What is claimed is:

1. An apparatus for moving a plurality of parts in a metallizer, the apparatus comprising:
    a. a plurality of plates secured to a center rod to create an integrated stack, each plate having an outer perimeter and the plurality of plates stacked vertically and spaced from one another such that the outer perimeter of the plurality of plates creates an outer perimeter of the integrated stack;
    b. a plurality of part supports arranged about the outer perimeter of each plate;
    c. a support frame secured to the center rod and extending beyond the outer perimeter of the integrated stack such that the support frame may rotate about a central axis of the integrated stack; and
    d. one or more rotation drive systems attached to the support frame and positioned such that one or more compliant drive fingers are in close proximity to the outer perimeter of the integrated stack.

2. The apparatus of claim 1 wherein the one or more rotation drive systems are attached to the support frame via mounting blocks.

3. The apparatus of claim 1 wherein a plurality of rotation drive systems are attached to the support frame.

4. The apparatus of claim 1 wherein the support frame is attached to one or more frame collars.

5. The apparatus of claim 4 wherein a low-friction insert is disposed between the center rod and at least one of the one or more frame collars.

6. The apparatus of claim 5 wherein the low-friction insert is disposed between the center rod and each of the one or more frame collars.

7. The apparatus of claim 4 further comprising a hub secured to the center rod.

8. The apparatus of claim 7 wherein the hub extends into the center rod.

9. The apparatus of claim 7 wherein the hub includes a connection port sized and shaped to secure the apparatus within a metallizer.

10. The apparatus of claim 1 wherein each of the one or more rotation drive systems include a shield.

11. The apparatus of claim 10 further wherein the shield is a mounting bracket and the one or more compliant drive fingers are secured to the mounting bracket.

12. The apparatus of claim 10 wherein the one or more compliant drive fingers are arranged in an arc with a radius approximately the same as the perimeter of the plurality of plates.

13. The apparatus of claim 11 further comprising a drive ring on each of the plurality of part supports, each of the drive rings positioned to ensure contact between the drive ring and the one or more compliant drive fingers as the drive ring passes the one or more compliant drive fingers.

14. The apparatus of claim 11 wherein the one or more rotation drive systems are attached to the support frame via mounting blocks.

15. The apparatus of claim 1 wherein the one or more compliant drive fingers are a plurality of compliant drive fingers.

16. The apparatus of claim 1 further comprising a drive ring on each of the plurality of part supports, each of the drive rings positioned to ensure contact between the drive ring and the one or more compliant drive fingers as the drive ring passes the one or more compliant drive fingers.

* * * * *